(12) United States Patent
Pao et al.

(10) Patent No.: US 11,349,009 B2
(45) Date of Patent: May 31, 2022

(54) HIGH-K GATE DIELECTRIC

(71) Applicant: Taiwan Semiconductor Manufacturing Co., Ltd., Hsin-Chu (TW)

(72) Inventors: Chia-Hao Pao, Hsinchu (TW); Chih-Hsuan Chen, Hsinchu (TW); Yu-Kuan Lin, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 17 days.

(21) Appl. No.: 16/901,340

(22) Filed: Jun. 15, 2020

(65) Prior Publication Data

US 2021/0391439 A1 Dec. 16, 2021

(51) Int. Cl.
| | |
|---|---|
| *H01L 29/51* | (2006.01) |
| *H01L 27/088* | (2006.01) |
| *H01L 29/423* | (2006.01) |
| *H01L 21/02* | (2006.01) |
| *H01L 21/8234* | (2006.01) |
| *H01L 21/28* | (2006.01) |
| *H01L 27/11* | (2006.01) |

(52) U.S. Cl.
CPC ...... *H01L 29/516* (2013.01); *H01L 21/02181* (2013.01); *H01L 21/02192* (2013.01); *H01L 21/28185* (2013.01); *H01L 21/823431* (2013.01); *H01L 21/823462* (2013.01); *H01L 27/0886* (2013.01); *H01L 29/42364* (2013.01); *H01L 29/517* (2013.01); *H01L 27/1104* (2013.01)

(58) Field of Classification Search
CPC ............ H01L 29/516; H01L 29/42364; H01L 29/517; H01L 21/02181; H01L 21/02192; H01L 21/28185; H01L 21/823431; H01L 21/823462; H01L 27/0886
See application file for complete search history.

(56) References Cited

U.S. PATENT DOCUMENTS

| | | |
|---|---|---|
| 10,304,835 B1 | 5/2019 | Tsai et al. |
| 2018/0226300 A1* | 8/2018 | Song ................ H01L 29/517 |
| 2020/0135879 A1* | 4/2020 | Cheng ............... H01L 27/0922 |

\* cited by examiner

*Primary Examiner* — Christine A Enad
(74) *Attorney, Agent, or Firm* — Haynes and Boone, LLP

(57) ABSTRACT

Semiconductor devices and methods are provided. A semiconductor device according to the present disclosure includes a first transistor having a first gate dielectric layer, a second transistor having a second gate dielectric layer, and a third transistor having a third gate dielectric layer. The first gate dielectric layer includes a first concentration of a dipole layer material, the second gate dielectric layer includes a second concentration of the dipole layer material, and the third gate dielectric layer includes a third concentration of the dipole layer material. The dipole layer material includes lanthanum oxide, aluminum oxide, or yttrium oxide. The first concentration is greater than the second concentration and the second concentration is greater than the third concentration.

20 Claims, 33 Drawing Sheets

HIGH-K GATE DIELECTRIC

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs, and, for these advances to be realized, similar developments in device fabrication are needed.

As geometry size of IC devices continues to shrink, it becomes more and more challenging to form features of the desirable shape. For example, in gate-last processes, a dummy gate stack is first formed as a placeholder for a later-formed metal gate stack to undergo a substantial portion of the fabrication processes and then the dummy gate stack is removed and replaced with the functional metal gate stack. To replace the dummy gate stack, the dummy gate stack is first removed to form a gate trench and then a plurality of layers is deposited in the gate trench to form the functional metal gate stack. In some instances, additional dipole layers or dielectric layer may be deposited over the gate dielectric layer to provide transistors with different threshold voltages. Because the shrinking geometry also reduces the dimensions of the gate trenches, these additional dipole layers and dielectric layers may reduce process window for satisfactorily depositing the plurality of layers in the functional metal gate structure. In cases where the gate trench is not straight, the process window may be further reduced. Therefore, while the conventional gate-last processes are adequate for their intended purposes, they are not satisfactory in all aspects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
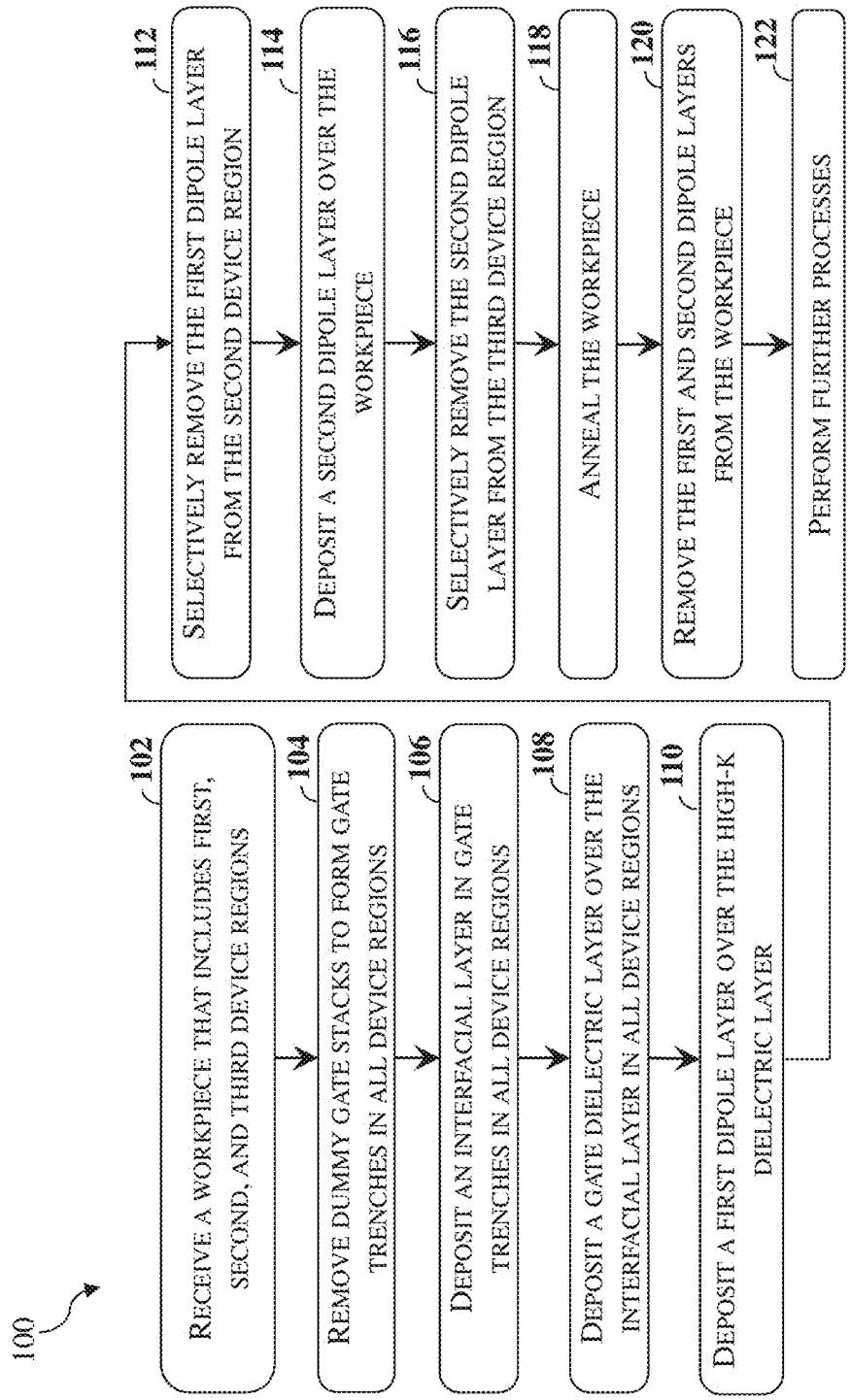
FIG. 1 illustrates a flowchart of a method of forming a semiconductor device, according to aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed interposing the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Metal gate stacks, which are commonplace in modern-day transistors, may be formed using a gate-first process or a gate-last process. In the former, the functional metal gate stack is formed before formation of several features, such as source/drain features and an interlayer dielectric layer. In the latter, a non-functional dummy gate stack is first formed as a placeholder for a later-formed metal gate stack to undergo fabrication processes for the source/drain feature and the interlayer and then the dummy gate stack is removed and replaced with the functional metal gate stack. To replace the dummy gate stack, the dummy gate stack is first removed to form a gate trench and then a plurality of layers is deposited in the gate trench to form the functional metal gate stack. In some instances, one or more dipole layers may be deposited over the gate dielectric layer to provide transistors with different threshold voltages. An interface dipole may be created at the interface between a dipole layer and an underlying silicon oxide interfacial layer due to oxygen atom density differential. Depending on the polarity of the interface dipole, the interface dipole may increase or reduce the threshold voltage of the subject transistor. While a dipole layer may be used to modulate the threshold voltage, an additional dipole layer may further reduce the process windows for satisfactorily depositing the plurality of layers in the functional metal gate stack. In cases where the gate trench is not straight, the process window may be further reduced. For example, before deposition of all the plurality of layers in the gate trench to form the functional metal gate stack, two sides of a layer may merge and close the opening of the trench, preventing deposition of subsequent layers in the gate trench.

To alleviate the foregoing problems, the present disclosure provides a method of forming a semiconductor device. In some embodiments of the present disclosure, the method includes depositing a gate dielectric layer over gate trenches in a first device region, a second device region, and a third device region on a workpiece. A first dipole layer is then deposited over the gate dielectric layer in gate trenches in a first device region, a second device region, and a third device region. The first dipole layer over the gate trench in the second device region is selectively removed while the gate dielectric layer in the first device region and the third device region remain covered by the first dipole layer. A second dipole layer is then deposited over the first dipole layer in the gate trenches in the first device region and the third device region, as well as the gate dielectric layer in the second device region. The first dipole layer and the second dipole layer are then removed from over the gate dielectric layer in the third device region. The workpiece is then annealed at a temperature between about 500° C. and about 900° C. such that ingredients in the first dipole layer and the second dipole layer may thermally diffuse into the gate dielectric layer to alter threshold voltages. After the first dipole layer and the second dipole layer are then removed from the gate trenches of the workpiece, a substantially identical gate structure is formed in the gate trenches in the first device region, the second device region, and the third device region to form a first transistor in the first device region, a second transistor in the second device region, and a third transistor in the third device region. The first transistor in the first device region, the second transistor in the second device region, and the third transistor in the third device region have different threshold voltages. Because the dipole layers are not included in the gate trenches and only serve as vehicles for diffusive dopants, the process window for forming the functional metal gate stack is not reduced. Embodiments having four device regions are also provided.

FIG. 1 illustrates a flow chart of a method 100 for forming a semiconductor device according to various aspects of the present disclosure. FIGS. 2-15 are fragmentary cross-sectional views of a workpiece at various stages of fabrication of the method 100 in FIG. 1. Additional steps can be provided before, during, and after method 100, and some of the steps described can be moved, replaced, or eliminated for additional embodiments of method 100. Additional features can be added in the contact structure depicted in FIGS. 2-15, and some of the features described below can be replaced, modified, or eliminated in other embodiments of the interconnect structure depicted in FIGS. 2-15.

Figure 2:
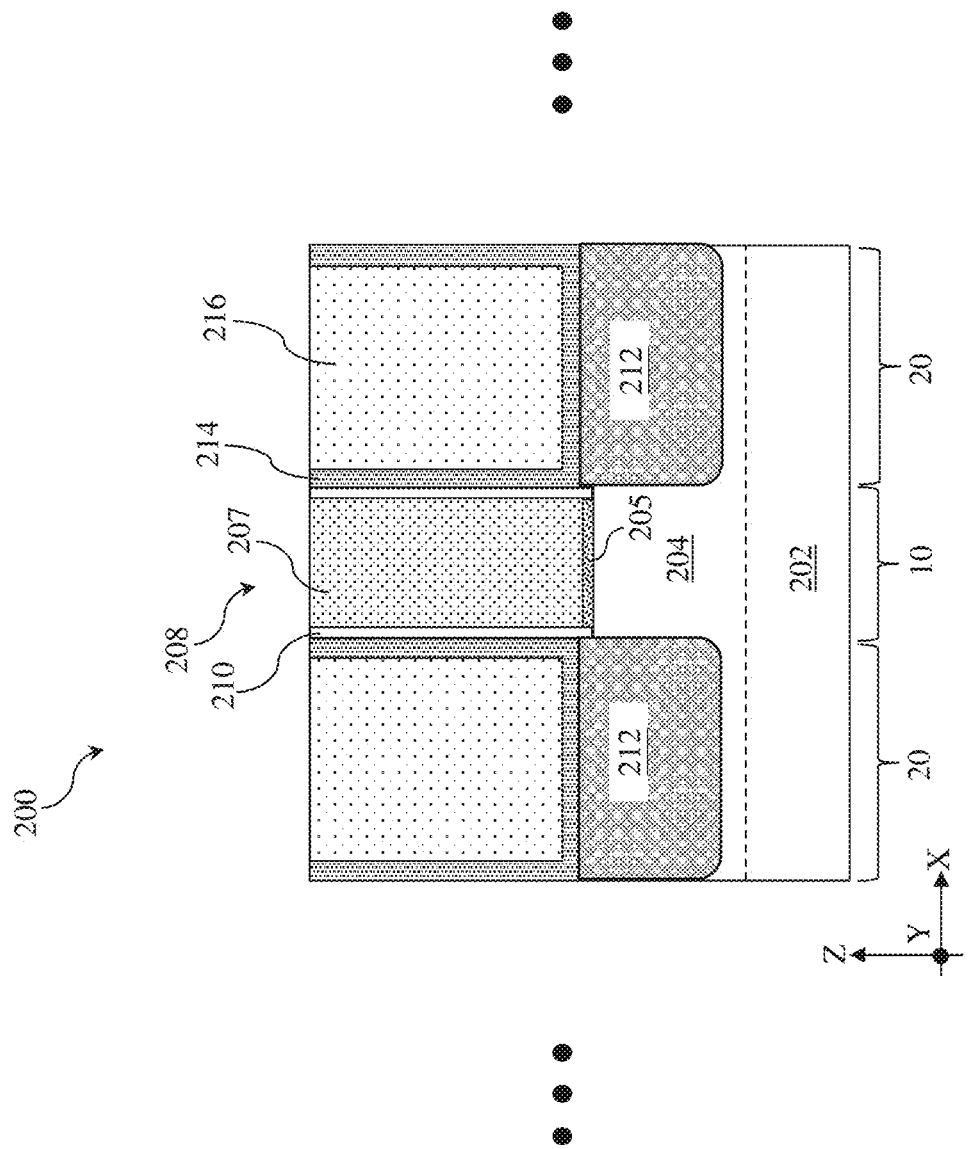
FIGS. 2-15 are fragmentary cross-sectional views of a workpiece during various operations of the method of FIG. 1, according to aspects of the present disclosure.

Referring to FIGS. 1 and 2, the method 100 includes a block 102 where a workpiece 200 is received. Upon conclusion of the method 100, the workpiece 200 may be fabricated into a semiconductor device 200. In that sense, the workpiece 200 may also be referred to as a semiconductor device 200 in suitable context. The semiconductor device 200 can be included in a microprocessor, a memory, and/or other IC device. In some implementations, the semiconductor device 200 is a portion of an IC chip, a system on chip (SoC), or portion thereof, that includes various passive and active microelectronic devices, such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. The transistors may be planar transistors or multi-gate transistors, such as fin-like FETs (FinFETs) or gate-all-around (GAA) transistors.

As illustrated in FIG. 2, the semiconductor device 200 includes a substrate (wafer) 202. In the depicted embodiment, substrate 202 includes silicon. Alternatively or additionally, substrate 202 includes another elemental semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. In some implementations, substrate 202 includes one or more group III-V materials, one or more group II-IV materials, or combinations thereof. In some implementations, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 202 can include various doped regions (not shown) configured according to design requirements of semiconductor device 200, such as p-type doped regions, n-type doped regions, or combinations thereof. P-type doped regions (for example, p-type wells) include p-type dopants, such as boron, indium, other p-type dopant, or combinations thereof. N-type doped regions (for example, n-type wells) include n-type dopants, such as phosphorus, arsenic, other n-type dopant, or combinations thereof. In some implementations, substrate 202 includes doped regions formed with a combination of p-type dopants and n-type dopants. The various doped regions can be formed directly on and/or in substrate 202, for example, providing a p-well structure, an n-well structure, a dual-well structure, a raised structure, or combinations thereof. An ion implantation process, a diffusion process, and/or other suitable doping process can be performed to form the various doped regions.

Semiconductor device 200 includes an active region 204 over substrate 202. The active region 204 may be a fin-shape semiconductor feature, or a vertical stack of nanostructures. As shown in FIG. 2, the active region 204 horizontally extends along the X-direction over the substrate 202 and extends vertically along the Z-direction from the substrate 202. In some implementations, the active region 204 may be a portion of substrate 202 (such as a portion of a material layer of substrate 202). For example, silicon active region 204 may be formed from silicon substrate 202. Alternatively, in some implementations, the active region 204 is defined in a material layer, such as one or more semiconductor material layers formed over substrate 202. For example, the active region 204 can include a semiconductor layer stack having various semiconductor layers (such as a heterostructure) disposed over substrate 202. The semiconductor layers can include any suitable semiconductor materials, such as silicon, germanium, silicon germanium, other suitable semiconductor materials, or combinations thereof. The semiconductor layers can include same or different materials, etching rates, constituent atomic percentages, constituent weight percentages, thicknesses, and/or configurations depending on design requirements of the semiconductor device 200. In some implementations, the semiconductor layer stack includes alternating semiconductor layers, such as semiconductor layers composed of a first material and semiconductor layers composed of a second material. For example, the semiconductor layer stack alternates silicon layers and silicon germanium layers (for example, SiGe/Si/SiGe/Si/SiGe/Si from bottom to top). In some implementations, the semiconductor layer stack includes semiconductor layers of the same material but with alternating constituent atomic percentages, such as semiconductor layers having a constituent of a first atomic percent and semiconductor layers having the constituent of a second atomic percent. For example, the semiconductor layer stack includes silicon germanium layers having alternating silicon and/or germanium atomic percentages (for example, $Si_aGe_b/Si_cGe_d/Si_aGe_b/Si_cGe_d/Si_aGe_b/Si_cGe_d$ from bottom to top, where a, c are different atomic percentages of silicon and b, d are different atomic percentages of germanium).

The active region 204 may be formed over substrate 202 by any suitable process. In some implementations, a combination of deposition, lithography and/or etching processes are performed to define the active region 204 illustrated in FIG. 2. For example, forming the active region 204 includes performing a lithography process to form a patterned resist layer over substrate 202 (or a material layer, such as a heterostructure, disposed over substrate 202) and performing an etching process to transfer a pattern defined in the patterned resist layer to substrate 202 (or the material layer, such as the heterostructure, disposed over substrate 202). The lithography process can include forming a resist layer on substrate 202 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process uses the patterned resist layer as an etch mask to remove portions of substrate 202 (or a material layer disposed over substrate 202). The etching process can include a dry etching process (for example, a reactive ion etching (RIE) process), a wet etching process, other suitable etching process, or combinations thereof. After the etching process, the patterned resist layer is removed from substrate 202, for example, by a resist stripping process. Alternatively, the active region 204 is formed by a multiple patterning process, such as a double patterning lithography (DPL) process (for example, a lithography-etch-lithography-etch (LELE) process, a self-aligned double patterning (SADP) process, a spacer-is-dielectric (SID) SADP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. In some implementations, directed self-assembly (DSA) techniques are implemented while forming the active region 204. Further, in some implementations, the exposure process can implement maskless lithography, electron-beam (e-beam) writing, ion-beam writing, and/or nanoimprint technology for patterning the resist layer and/or other layers.

An isolation feature (not shown) is formed over and/or in substrate 202 to isolate various regions, such as various device regions, of the semiconductor device 200. For example, the isolation feature separates and isolates the active region 204 from an adjacent active region. In some embodiment, the isolation feature may surround a bottom portion of the active region 204 and expose a top portion of the active region 204. The isolation feature may include silicon oxide, silicon nitride, silicon oxynitride, other suitable isolation material (for example, including silicon, oxygen, nitrogen, carbon, or other suitable isolation constituent), or combinations thereof. The isolation feature can include different structures, such as shallow trench isolation (STI) structures, deep trench isolation (DTI) structures, and/or local oxidation of silicon (LOCOS) structures. In some implementations, STI features can be formed by etching a trench in substrate 202 (for example, by using a dry etch process and/or wet etch process) and filling the trench with insulator material (for example, by using a chemical vapor deposition process or a spin-on glass process). A chemical mechanical polishing (CMP) process may be performed to remove excessive insulator material and/or planarize a top surface of isolation feature. In some implementations, STI features can be formed by depositing an insulator material over substrate 202 after forming the active region 204 (in some implementations, such that the insulator material layer fills gaps (trenches) between the active region 204 and an adjacent active region) and etching back the insulator material layer to form isolation feature. In some implementations, the isolation feature includes a multi-layer structure that fills trenches, such as a bulk dielectric layer disposed over a liner dielectric layer, where the bulk dielectric layer and the liner dielectric layer include materials depending on design requirements (for example, a bulk dielectric layer that includes silicon nitride disposed over a liner dielectric layer that includes thermal oxide).

In embodiments illustrated in FIG. 2, the workpiece 200 includes a dummy gate stack 208 over and around a channel region 10 in the active region 204. Each of the dummy gate stack 208 may include a dummy gate dielectric layer 205 and a dummy gate electrode 207. In the embodiments represented in FIG. 2, the dummy gate stack 208 includes a dummy gate dielectric layer 205 over the active region 204 and a dummy gate electrode 207 over the dummy gate dielectric layer 205. In some implementations, the dummy gate dielectric layer 205 may be formed of silicon oxide and the dummy gate electrode 207 may be formed of polysilicon. A gate spacer layer 210 may be formed along sidewalls of the dummy gate stack 208 by any suitable process and include a dielectric material. The dielectric material for the gate spacer layer 210 may include silicon, oxygen, carbon, nitrogen, other suitable material, or combinations thereof (for example, silicon oxide, silicon nitride, silicon oxynitride, or silicon carbide). In some implementations, the gate spacer layer 210 may include a multi-layer structure, such as a first spacer layer that includes silicon nitride and a second spacer layer that includes silicon oxide. In some implementations, the gate spacer layer 210 may include more than one set of spacers, such as seal spacers, offset spacers, sacrificial spacers, dummy spacers, and/or main spacers, formed adjacent to the gate stacks. It is noted that the cross-sectional view in FIG. 2 depicts a cross section that cut across a top surface of the active region 204 along the X-direction. For example, when the active region 204 is a fin-shape active region (or a fin), the dummy gate stack 208 in FIG. 2 are shown to be disposed on a top surface of the fin.

The workpiece 200 may further include source/drain features 212 formed in source/drain regions 20 adjacent the channel region 10. As shown in FIG. 2, the source/drain features 212 are disposed adjacent the dummy gate stack 208. In some implementations, source/drain features 212 are formed over source/drain regions 20 of the active region 204 using an epitaxy process. The epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. Source/drain features 212 may be doped with n-type dopants and/or p-type dopants. In some implementations, where the transistor is configured as an n-type device (for example, having an n-channel), source/drain features 212 can be silicon-containing epitaxial layers or silicon-carbon-containing epitaxial layers doped with phosphorus, other n-type dopant, or combinations thereof (for example, forming Si:P epitaxial layers or Si:C:P epitaxial layers). In some implementations, where the transistor is configured as a p-type device (for example, having a p-channel), source/drain features 212 can be silicon-and-germanium-containing epitaxial layers doped with boron, other p-type dopant, or combinations thereof (for example, forming Si:Ge:B epitaxial layers). In some implementations, annealing processes are performed to activate dopants in source/drain features 212 of the semiconductor device 200.

The workpiece 200 may include a contact etch stop layer (CESL) 214 deposited on the source/drain features 212. In some instances, the CESL 214 may also be deposited over the side surfaces of the gate spacer layer 210. In some embodiments, the CESL 214 may be formed of silicon nitride, silicon oxynitride, or silicon carbonitride and may be conformally deposited using atomic layer deposition (ALD). A dielectric layer 216, which may also be referred to as an interlayer dielectric (ILD) layer 216, is deposited over the CESL 214. The dielectric layer 216 may be formed using a flowable chemical vapor deposition (FCVD) process. In some implementations, after deposition using a FCVD process, the deposited dielectric layer 216 may be cured by incidence of ultraviolet (UV) radiation, annealing, or both. In some embodiments, the dielectric layer 216 may include a dielectric material including, for example, silicon oxide, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, other low-k dielectric material, or combinations thereof.

Figure 3:
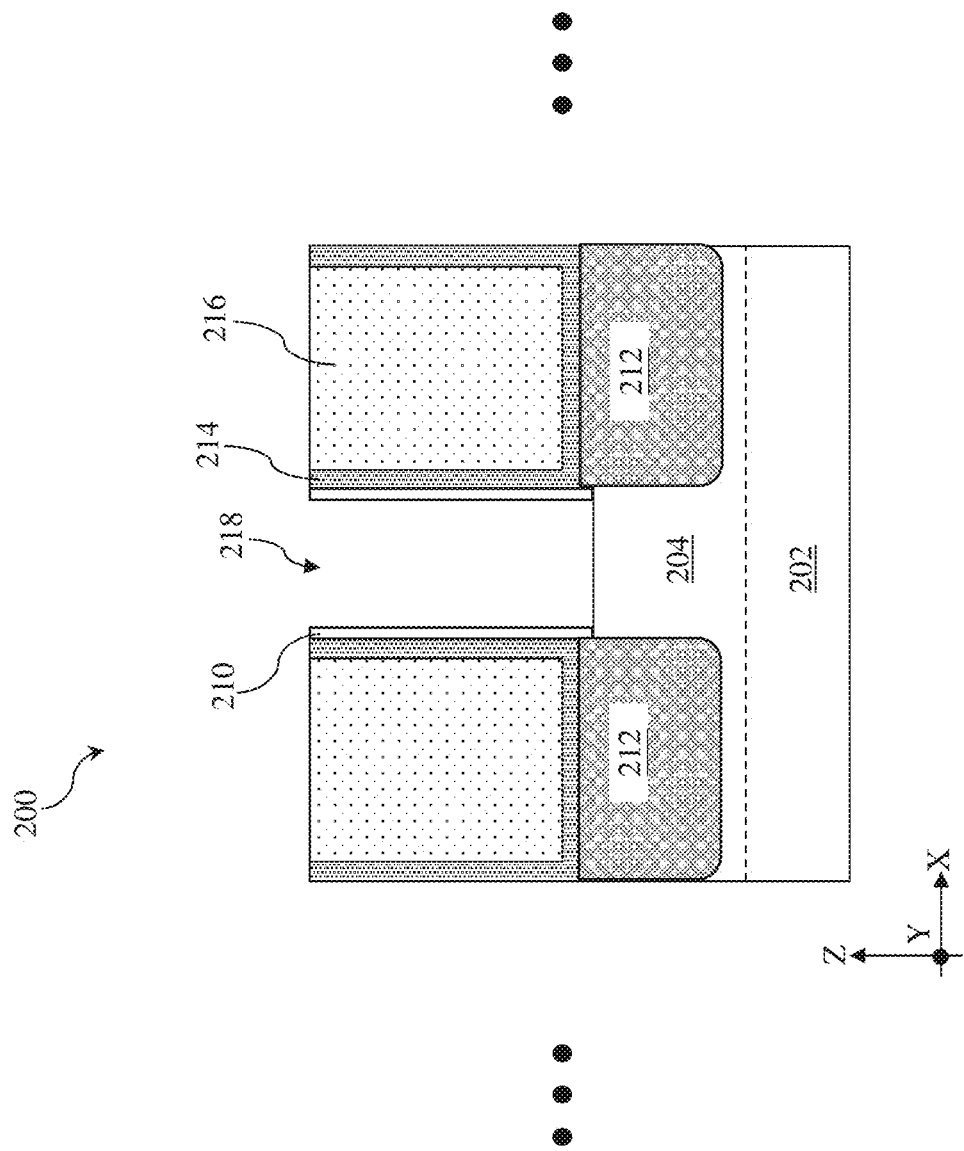

Referring to FIGS. 1 and 3, the method 100 includes a block 104 where the dummy gate stack 208 is removed to form a gate trench 218. In some embodiments, the dummy gate stack 208 may be removed using a combination of suitable dry etch processes and wet etch processes to form the gate trench 218. The gate trench 218 exposes the channel region 10 of the active region 204. While the dummy gate stack 208 and the gate trench 218 are depicted as having straight sidewalls along the Z direction, they may not be straight and may include a necking profile in some implementations. The necking profile may reduce the process window to deposit a plurality of layers in the gate trench 218 to form the functional metal gate stack.

Figure 4:
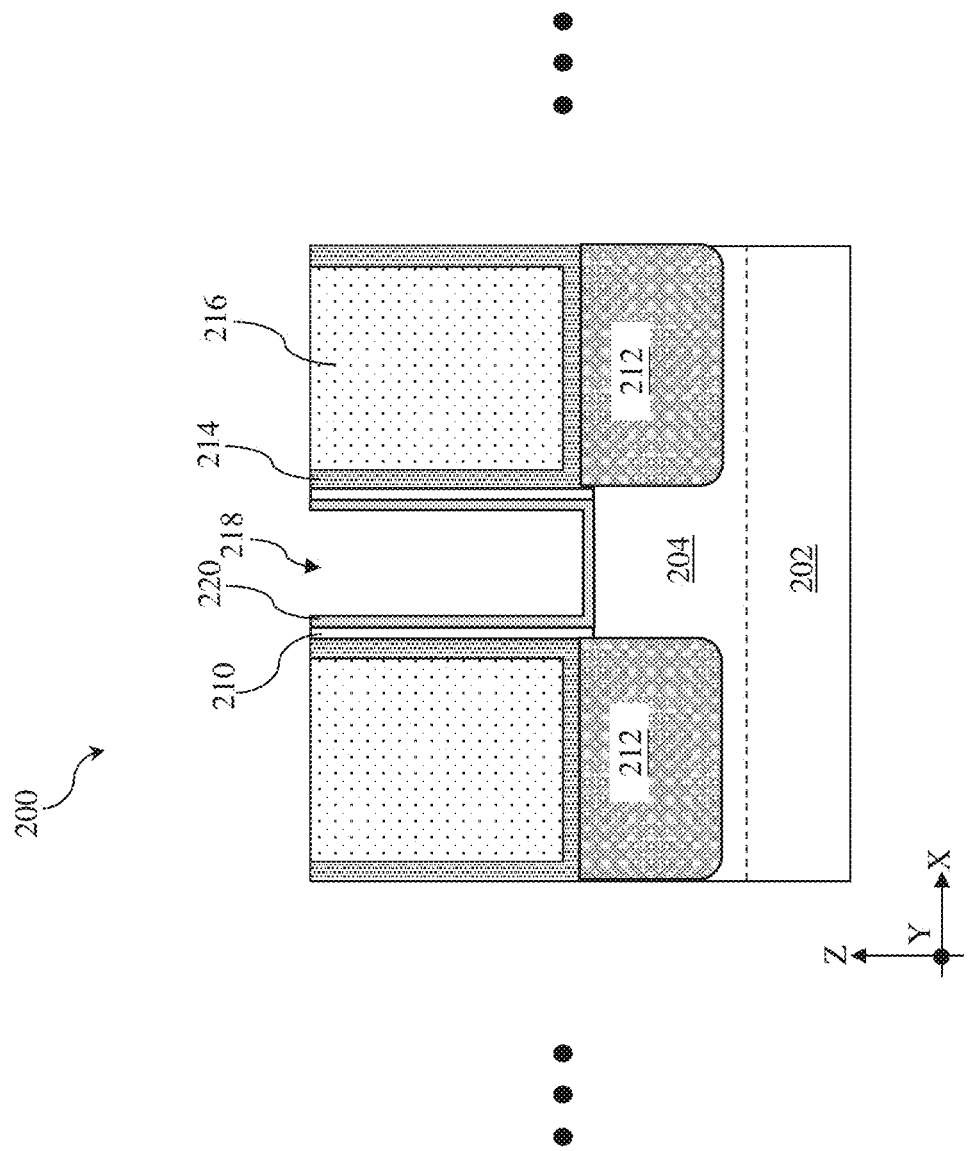

Referring to FIGS. 1 and 4, the method 100 includes a block 106 where an interfacial layer 220 is deposited in the gate trench 218. In some implementations, the interfacial layer 220 may be formed of silicon oxide.

Figure 5:
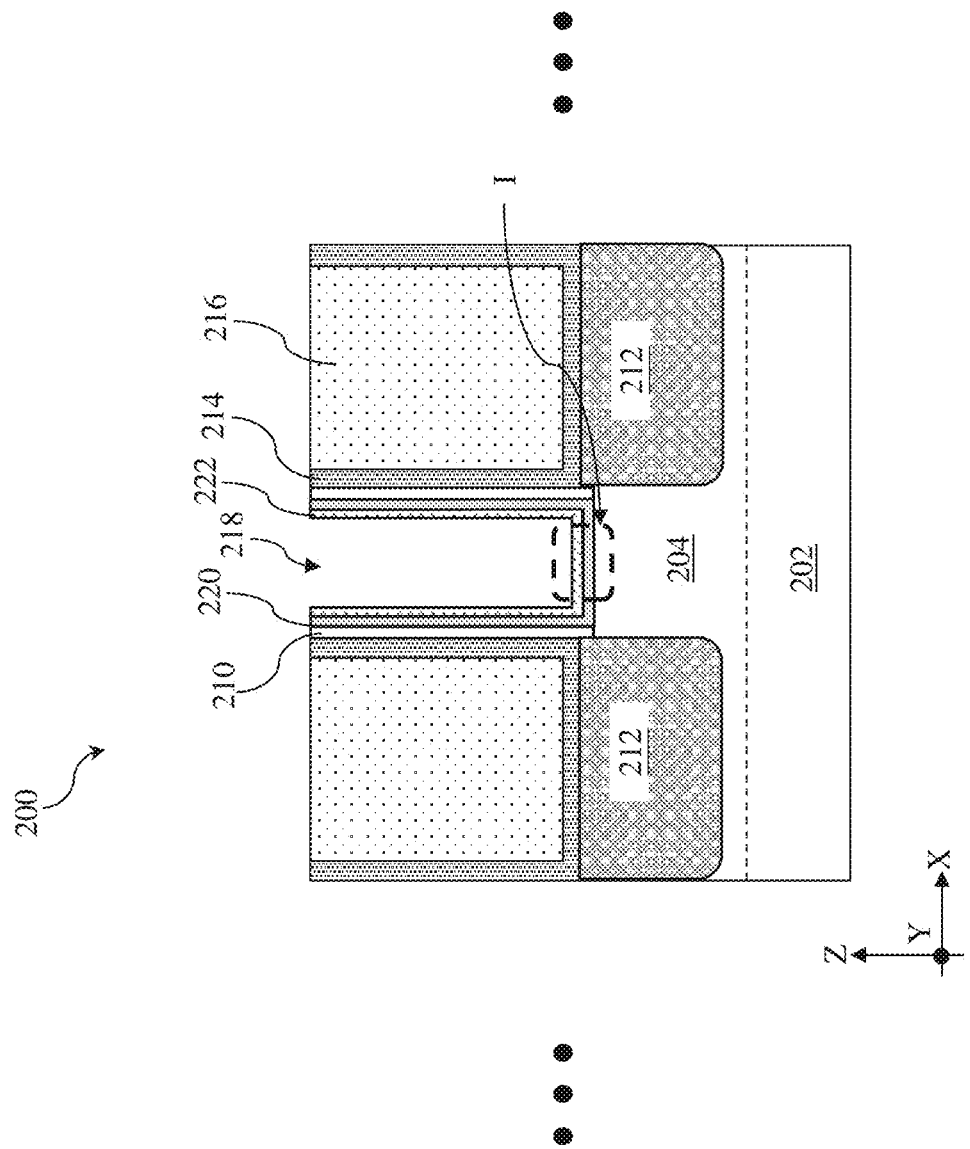

Referring to FIGS. 1 and 5, the method 100 includes a block 108 where a gate dielectric layer 222 is deposited over the interfacial layer 220. The gate dielectric layer 222 may include dielectric materials having a high dielectric constant, for example, greater than a dielectric constant of silicon oxide ($k \approx 3.9$). Exemplary high-k dielectric materials include hafnium, zirconium, tantalum, titanium, oxygen, nitrogen, other suitable constituent, or combinations thereof. In some implementations, the gate dielectric layer 222 may include includes a high-k dielectric material including, for example, $HfO_2$, $HfSiO$, $HfSiON$, $HfTaO$, $HfTiO$, $HfZrO$, $ZrO_2$, $TiO_2$, $Ta_2O_5$, other suitable high-k dielectric material, or combinations thereof.

As will be described below, the workpiece 200 may include multiple device regions (such as three device regions, four device regions, or more device regions) for transistors having different threshold voltages and the structure shown in FIGS. 2-5 may be repeated across these multiple device regions but the repeated structures are omitted, which is representatively shown by ellipses (" . . . ") in FIGS. 2-5. Operations of the method 100 that treat different device regions differently will be described below in conjunction with FIGS. 6-15. For simplicity and clarity of descriptions, FIGS. 6-14 illustrate fragmentary cross-sectional views of area "I" in different device regions.

Figure 6:
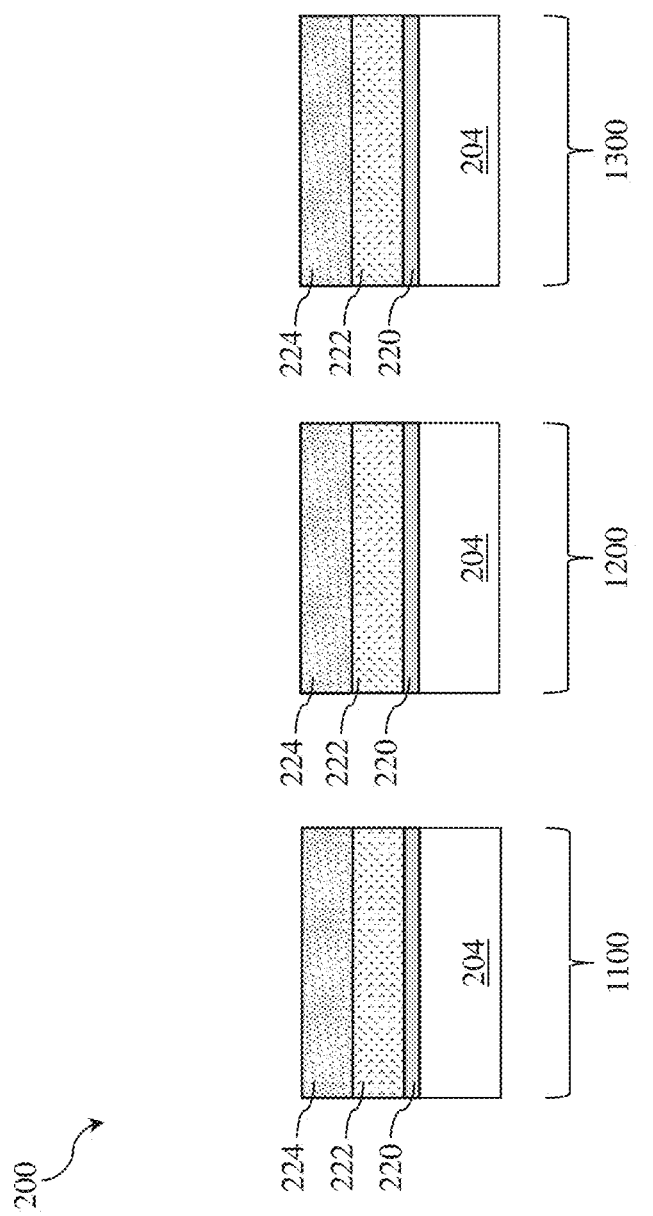

Referring to FIGS. 1 and 6, the method 100 includes a block 110 where a first dipole layer 224 is deposited over the gate dielectric layer 222. In the embodiments illustrated in FIGS. 6-15, the workpiece 200 includes three device regions—a first device region 1100, a second device region 1200, and a third device region 1300. As described above, FIG. 6 illustrates the fragmentary cross-sectional views of the area "I" in the first device region 1100, the second device region 1200, and the third device region 1300. The first dipole layer 224 is deposited on the gate dielectric layer 222 in the gate trenches in the first device region 1100, the second device region 1200, and the third device region 1300. In some embodiments, the first dipole layer 224 may be formed of lanthanum oxide, yttrium oxide, or aluminum oxide and may be deposited using atomic layer deposition (ALD). In some implementations, the ALD process used to form the first dipole layer 224 may include between about 2 and about 10 cycles. In those implementations, the first dipole layer 224 may have a thickness between about 1 Å and about 10 Å. In one embodiment, the first dipole layer 224 may be formed of lanthanum oxide.

Figure 7:
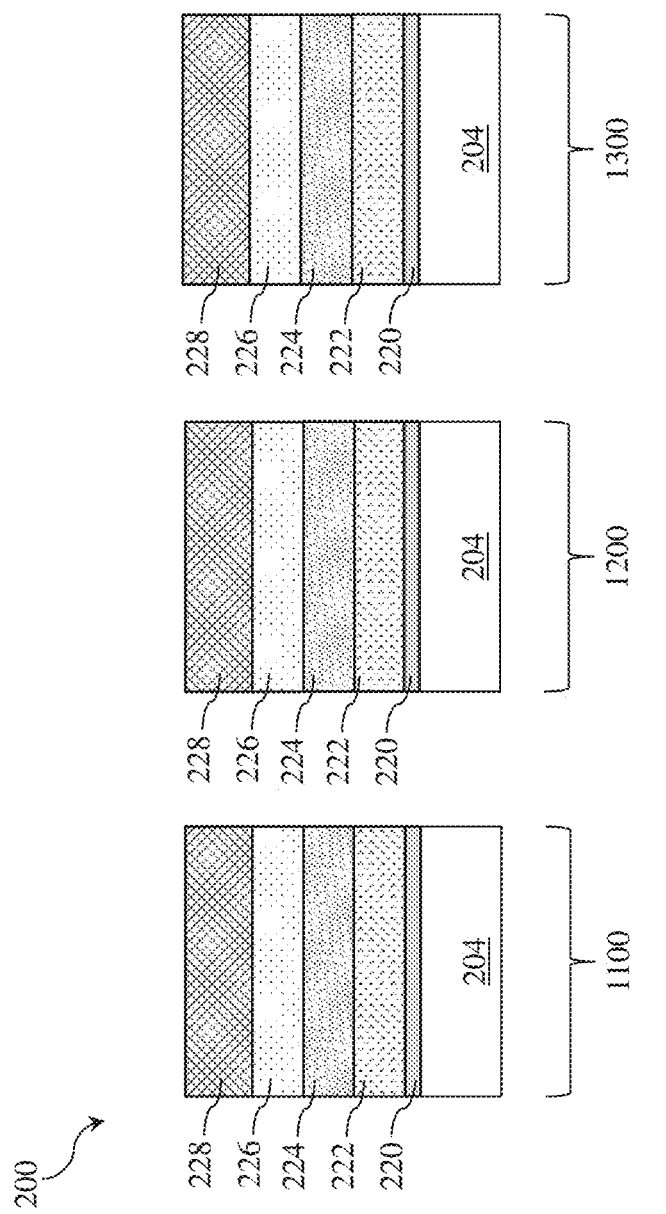
Figure 8:
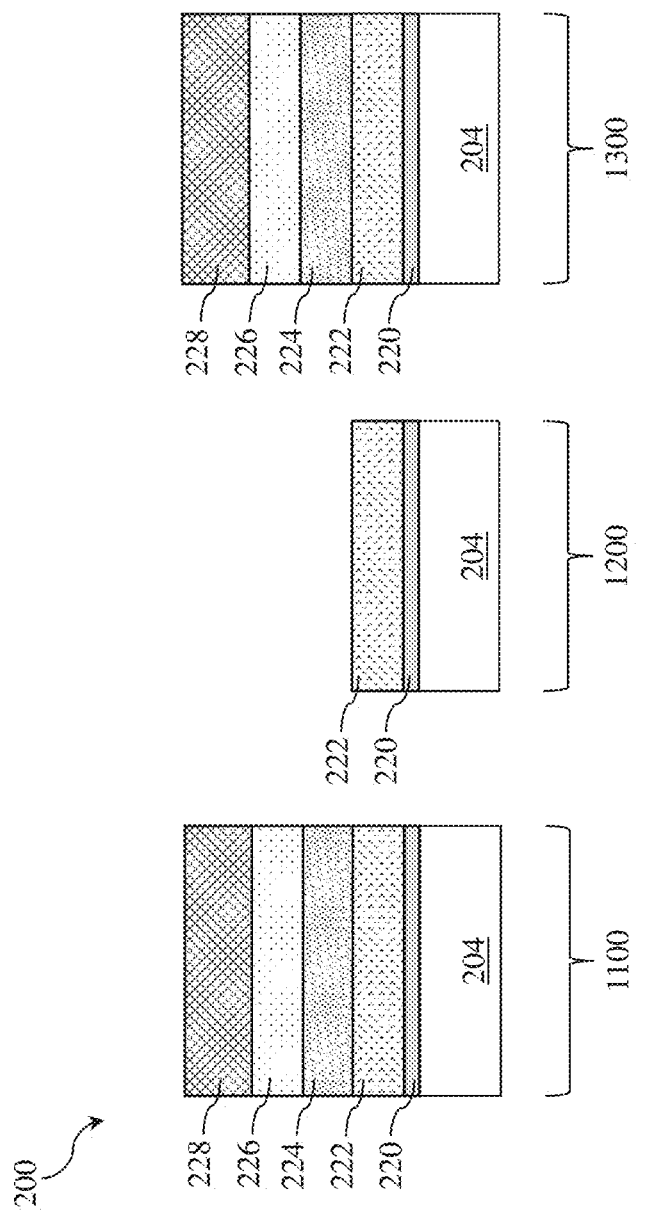
Figure 9:
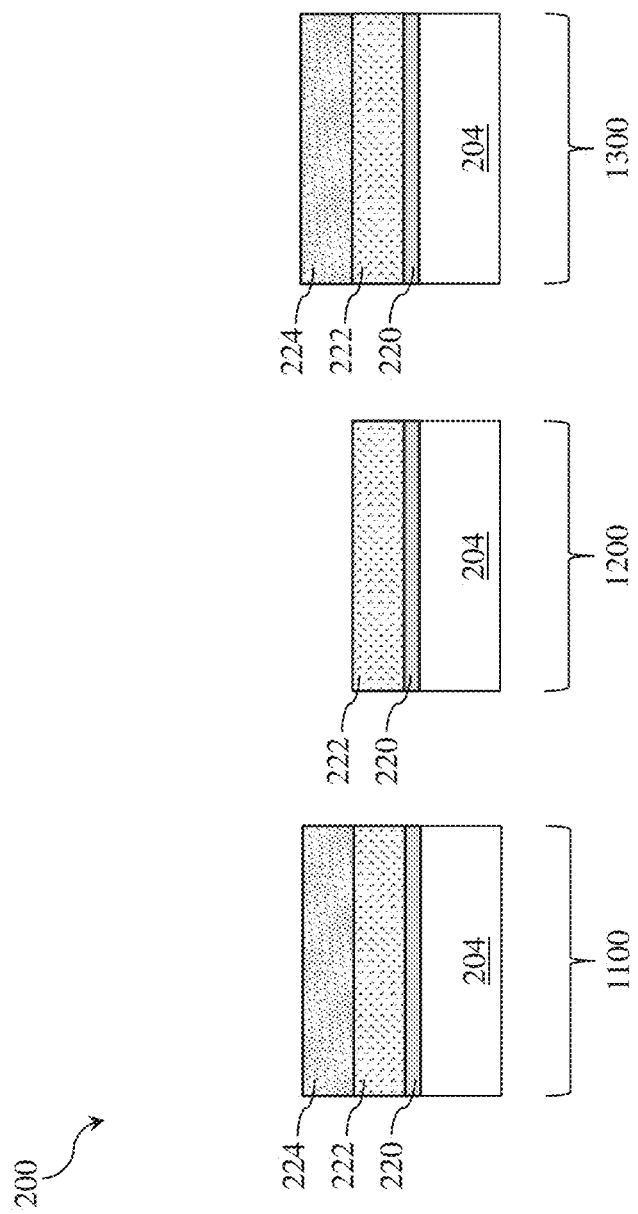

Referring to FIGS. 1, 7, 8, and 9, the method 100 includes a block 112 where the first dipole layer 224 is selectively removed from the second device region 1200. In some embodiments, photolithography techniques and etch techniques may be used to perform the operations at block 112. An example process is shown in FIGS. 7-9. Reference is first made to FIG. 7. A hard mask layer 226 is first formed over the first dipole layer 224 and a bottom antireflective coating (BARC) layer 228 is deposited over the hard mask layer 226. In some instances, the hard mask layer 226 may be a single layer or a multi-layer. When the hard mask layer 226 is a single layer, the hard mask layer 226 may include silicon oxide, silicon nitride, or silicon oxynitride. When the hard mask layer 226 is a multi-layer, the hard mask layer 226 may include a silicon layer and a silicon nitride layer on the silicon layer. The BARC layer 228 may include silicon oxynitride, a polymer, or a suitable material. To pattern the BARC layer 228 and the hard mask layer 226, a photoresist layer may be blanketly deposited over the workpiece 200, including over the BARC layer 228 in the first device region 1100, the second device region 1200, and the third device region 1300. The photoresist layer may be a single layer or a multi-layer, such as a tri-layer. The photoresist layer is then exposed to radiation going through or reflected from a mask, baked in a post-bake process, and developed in a developer solution to form a patterned photoresist mask. The BARC layer 228 and the hard mask layer 226 are then patterned using the patterned photoresist mask to form an etch mask having an opening over the second device region 1200. The etch mask is then used in an etch process to selectively etch away the first dipole layer 224 in the gate trench in the second device region 1200, as illustrated in FIG. 8. The etch process may be a dry etch process, a wet etch process, or a suitable etch process. Referring to FIG. 9, after the first dipole layer 224 is selectively removed from the gate trench in the second device region 1200, the hard mask layer 226 and the BARC layer 228 in the first device region 1100 and the third device region 1300 are removed using a suitable etching process.

Figure 10:
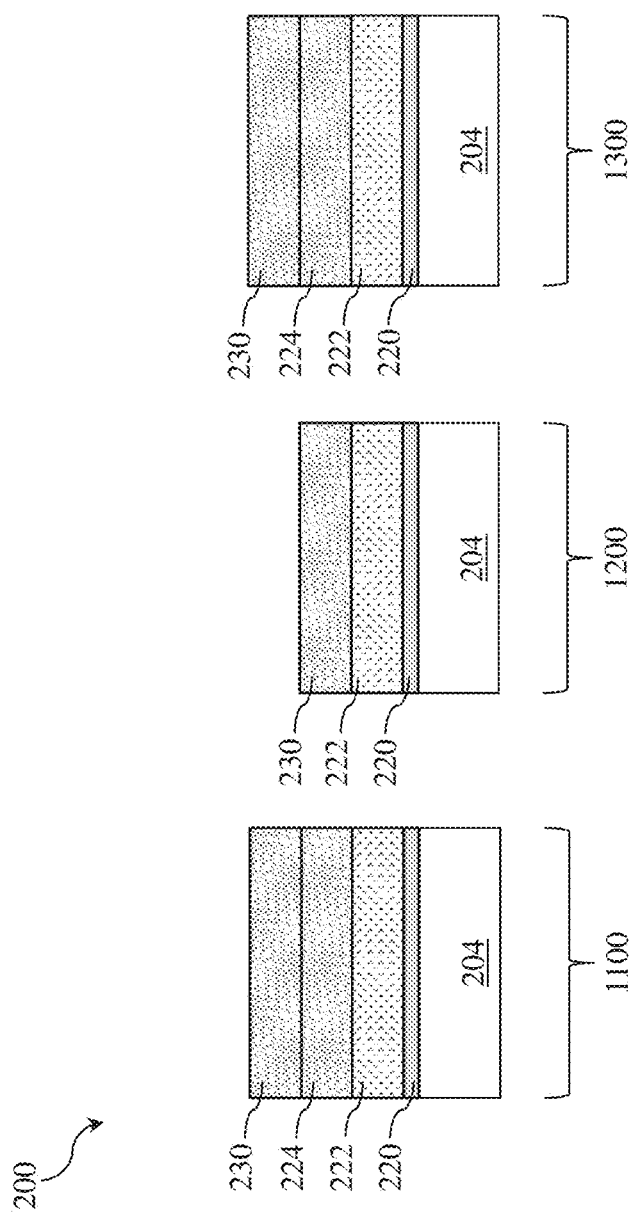

Referring to FIGS. 1 and 10, the method 100 includes a block 114 where a second dipole layer 230 is deposited over the workpiece 200. As shown in FIG. 10, the second dipole layer 230 is deposited on the first dipole layer 224 in the gate trenches in the first device region 1100 and the third device region 1300 as well as on the gate dielectric layer 222 in the gate trench in the second device region 1200. In some embodiments, the second dipole layer 230 and the first dipole layer 224 may have the same composition. Similar to the first dipole layer 224, the second dipole layer 230 may also be formed of lanthanum oxide, yttrium oxide, or aluminum oxide and may be deposited using atomic layer deposition (ALD). In some implementations, the ALD process used to form the second dipole layer 230 may include between about 2 and about 10 cycles. In those implementations, the second dipole layer 230 may have a thickness between about 1 Å and about 10 Å. In one embodiment, the second dipole layer 230 may be formed of lanthanum oxide.

Figure 11:
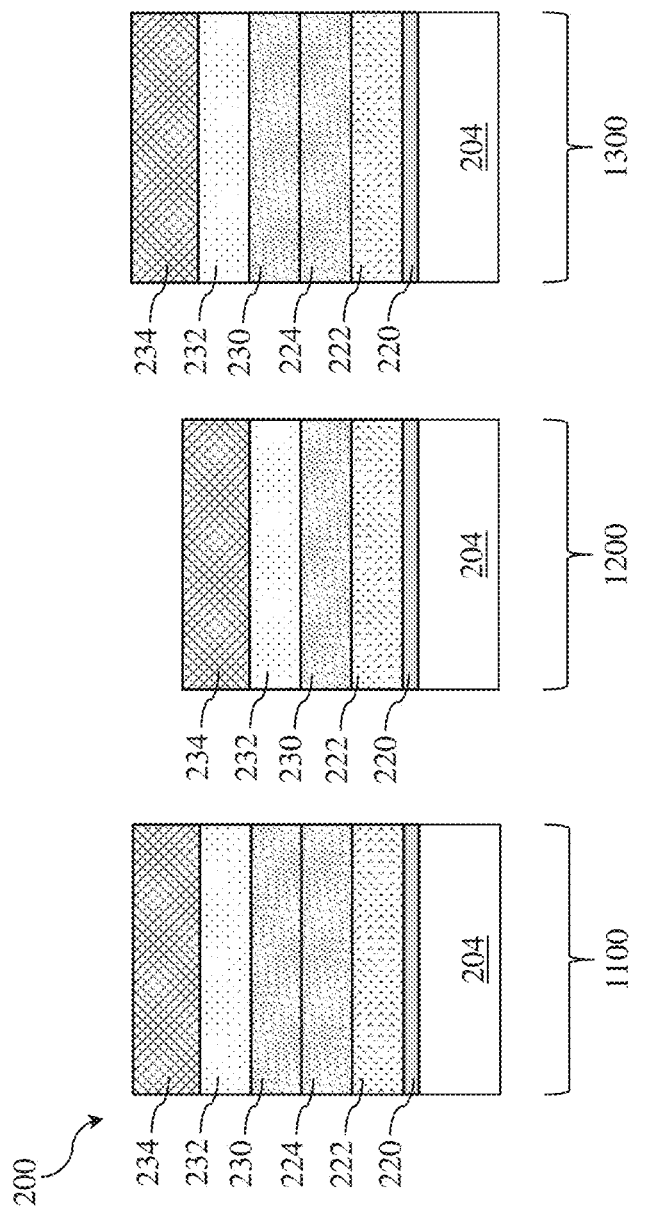
Figure 12:
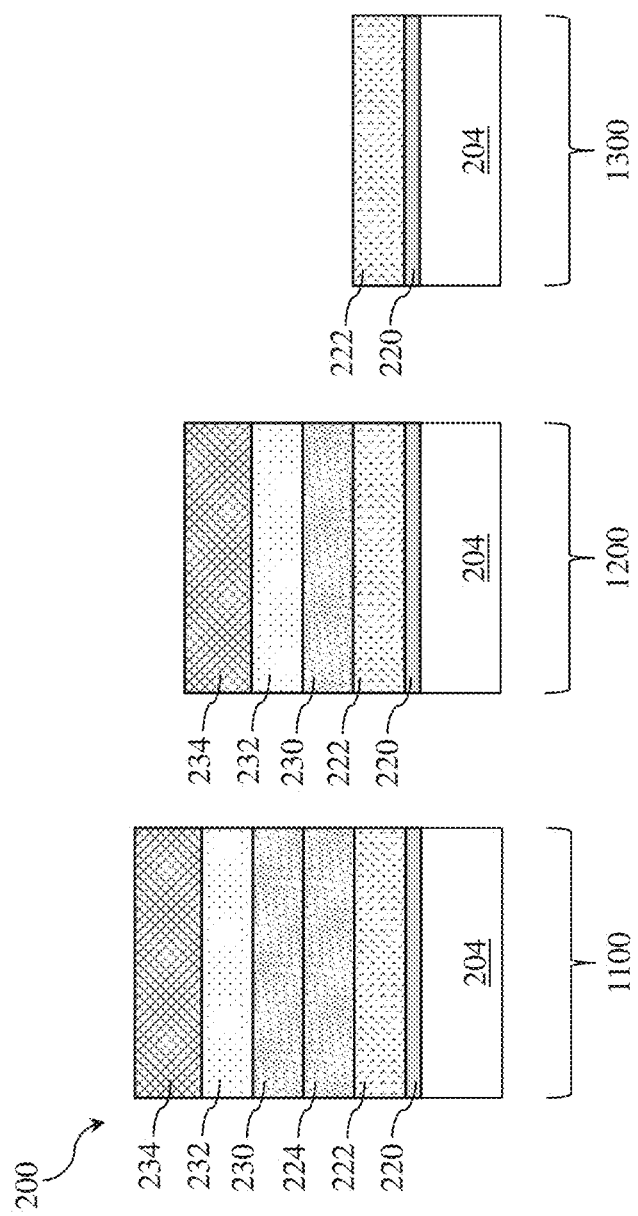
Figure 13:
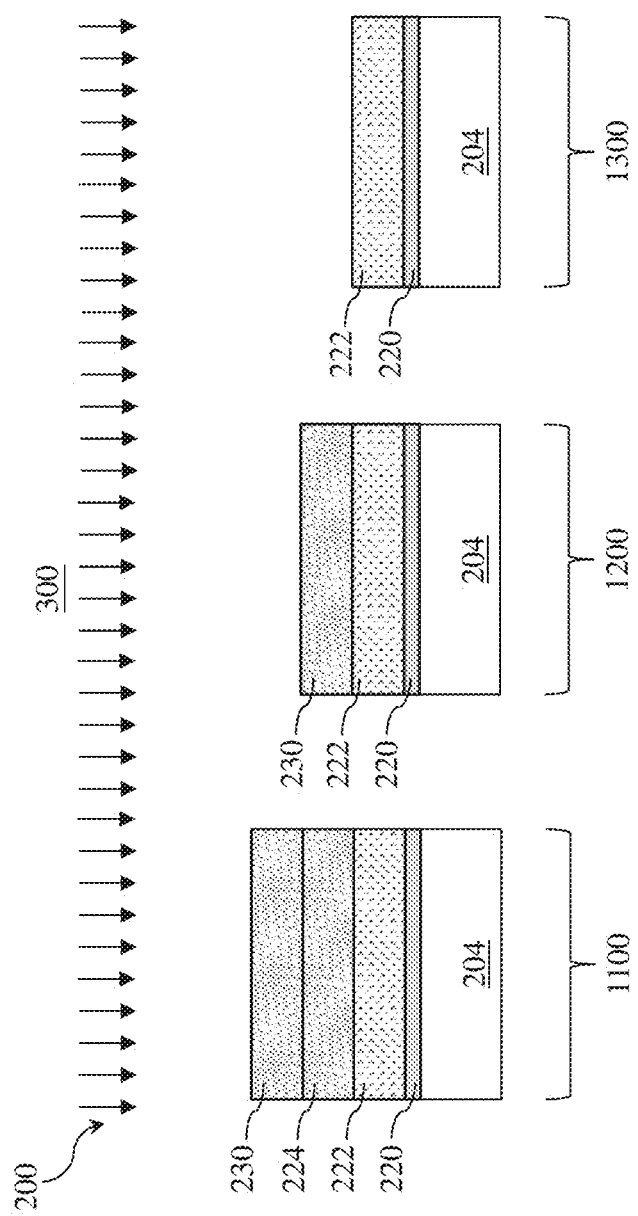

Referring to FIGS. 1, 11, 12, and 13, the method 100 includes a block 116 where the second dipole layer 230 is selectively removed from the third device region 1300. Similar to operations at block 112, operations at block 116 may also be performed using photolithography and etch techniques. For example, a hard mask layer 232 and a BARC layer 234 may be formed over the second dipole layer 230, as shown in FIG. 11. As the hard mask layer 232 may be similar to the hard mask layer 226 and the BARC layer 234 may be similar to the BARC layer 228, detailed descriptions of the hard mask layer 232 and the BARC layer 234 are omitted for brevity. Thereafter a photoresist layer may then be deposited over the BARC layer 234. The photoresist layer, the BARC layer 234, and the hard mask layer 232 are then patterned in fashions similar to those described with respect to block 112 and will not be repeated here. The patterned hard mask layer 232 allows selective removal of the first dipole layer 224 and the second dipole layer 230 in the gate trench in the third device region 1300, exposing the gate dielectric layer 222 in the gate trench in the third device region 1300. As illustrated in FIG. 12, at this point, the gate trench in the first device region 1100 includes thereover the first dipole layer 224 and the second dipole layer 230; the gate trench in the second device region 1200 includes thereover the second dipole layer 230; and the gate trench in the third device region 1300 is free of the first dipole layer 224 and the second dipole layer 230. Put differently, the total thickness (along the Z direction) of the first dipole layer 224 and the second dipole layer 230 in the gate trench in the first device region 1100 is greater than the total thickness of the second dipole layer 230 in the gate trench in the second device region 1200, while the gate trench in the third device region 1300 is free of any dipole layer. After the first dipole layer 224 and the second dipole layer 230 are selectively removed from the gate trench in the third device region 1300, the hard mask layer 232 and the BARC layer 234 may then be removed from the first device region 1100 and the second device region 1200, as illustrated in FIG. 13.

Referring to FIGS. 1 and 13, the method 100 includes a block 118 where the workpiece 200 is annealed in an anneal process 300. At block 118, the anneal process 300 is used to thermally drive elements in the first dipole layer 224 and/or the second dipole layer 230 into the gate dielectric layer 222 in the gate trenches in the first device region 1100 and the second device region 1200. The first dipole layer 224 and the second dipole layer 230 serve as a diffusion doping vehicle to bring its elements to be in direct contact with the gate dielectric layer 222. The anneal process 300 may be a rapid thermal anneal (RTA) process, a laser spike anneal process, a flash anneal process, or a furnace anneal process. In some implementation, the anneal process 300 includes a high anneal temperature between about 500° C. and about 900° C. so as to allow lanthanum, yttrium, or aluminum in the first dipole layer 224 and/or the second dipole layer 230 to diffuse into the gate dielectric layer 222 in gate trenches in the first device region 1100 and the second device region 1200. Because the gate trench in the third device region 1300 is free of any dipole layer, the anneal process 300 at block 118 does not result in any dipole layer material diffusing into the gate dielectric layer 222 in the third device region 1300. In some implementations, the anneal process 300 may last between about 5 seconds and about 20 seconds.

Figure 14:
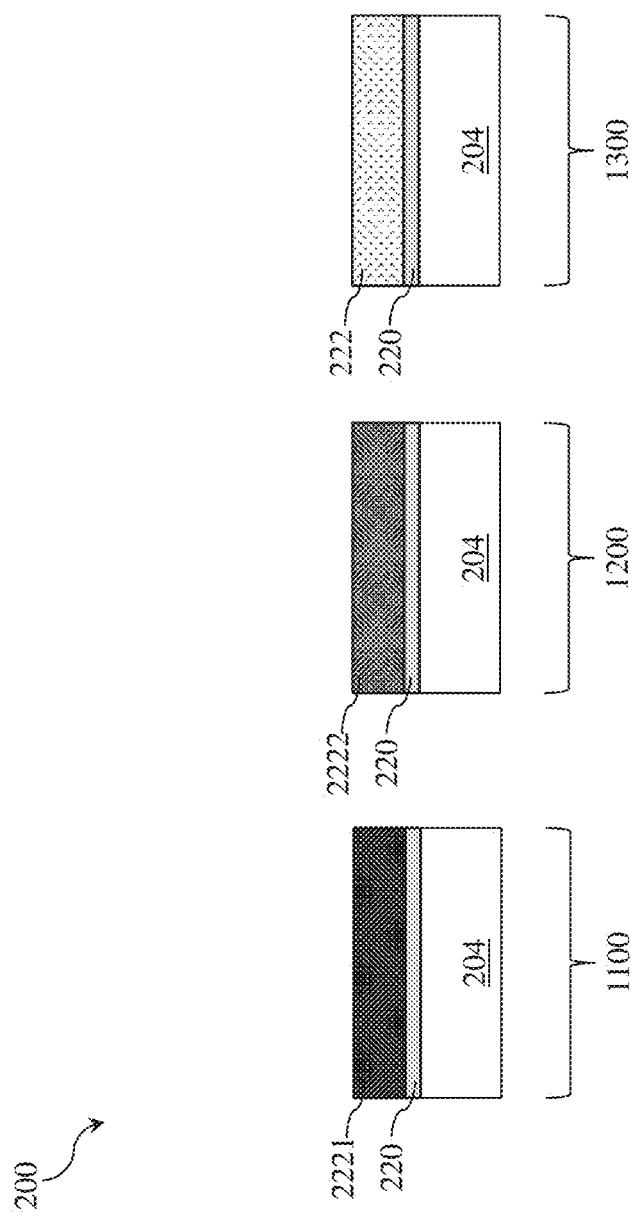

Referring to FIGS. 1 and 14, the method 100 include a block 120 where the first dipole layer 224 and the second dipole layer 230 are removed from the workpiece 200. After the element in the first dipole layer 224 and the second dipole layer 230 is thermally driven into the gate dielectric layer 222 at block 118, the first dipole layer 224 and the second dipole layer 230 are removed from the gate trench in the first device region 1100 and the second dipole layer 230 is removed from the gate trench in the third device region 1300. The operations at block 120 may be performed using a dry etch process, a wet etch process, or a suitable etch process. As shown in FIG. 14, the anneal process 300 at block 118 results in a first gate dielectric layer 2221 in the gate trench in the first device region 1100 and a second gate dielectric layer 2222 in the gate trench in the second device region 1200. Due to lack of any dipole layer, the gate dielectric layer 222 in the gate trench in the third device region 1300 remains substantially unchanged.

It has also been observed that a thicker dipole layer contributes to a greater doping concentration of the dipole layer material in the gate dielectric layer 222. For example, when the gate dielectric layer 222 is formed of hafnium oxide and the first dipole layer 224/second dipole layer 230 is formed of lanthanum oxide, operations at block 118 may result in a first lanthanum concentration in the first gate dielectric layer 2221 in the first device region 1100 and a second lanthanum concentration in the second gate dielectric layer 2222 in the second device region 1200. Because the gate trench in the third device region 1300 is free of any dipole layer, the gate dielectric layer 222 in the gate trench in the third device region 1300 includes a third lanthanum concentration that is zero. Because the gate trench in the first device region 1100 includes both the first dipole layer 224 and the second dipole layer 230, the first lanthanum concentration is greater than the second lanthanum concentration, which is greater than the zero third lanthanum concentration. Each of the first, second and third lanthanum concentration may be represented as a ratio of lanthanum concentration (i.e., [lathanum] or [La] from the first dipole layer 224/second dipole layer 230) to hafnium (i.e., [Hafnium] or [Hf] in the gate dielectric layer 222). In the example described above, the first lanthanum concentration (i.e., first lanthanum to hafnium ratio) may be about 0.4 ([La]/[Hf]) and the second lanthanum concentration (i.e., second lanthanum to hafnium ratio) may be about 0.2 ([La]/[Hf]), while the third lanthanum concentration (i.e., third lanthanum to hafnium ratio) is zero. The foregoing description generally applies to other dipole layer materials, such as yttrium and aluminum, and other gate dielectric material, such as HfSiO, HfSiON, HfTaO, HfTiO, HfZrO, $ZrO_2$, $TiO_2$, $Ta_2O_5$, provided that different dipole layer material may have different diffusivity and different dipole layer may have different solid solubility in different gate dielectric layers.

Figure 15:
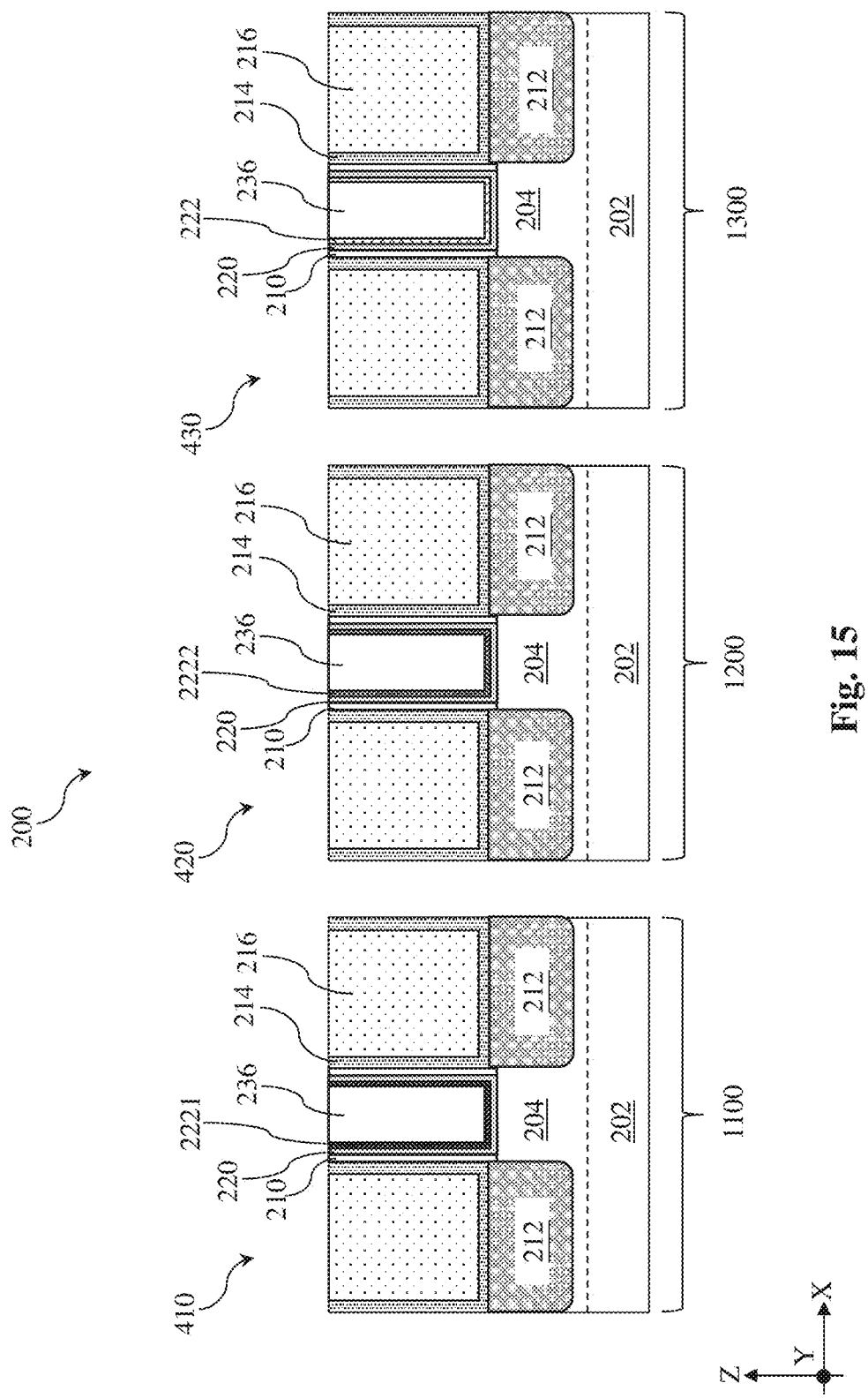

Referring to FIGS. 1 and 15, the method 100 includes a block 122 where further processes are performed to form a first transistor 410 in the first device region 1100, a second transistor 420 in the second device region 1200, and a third transistor 430 in the third device region 1300. As shown in FIG. 15, the first transistor 410 includes the first gate dielectric layer 2221, the second transistor 420 includes the second gate dielectric layer 2222, and the third transistor 430 includes the gate dielectric layer 222. Each of the first transistor 410, the second transistor 420, and the third transistor 430 includes a functional metal gate stack 236 in addition to the interfacial layer 220 and the first gate dielectric layer 2221/second gate dielectric layer 2222/gate dielectric layer 222. Because the first gate dielectric layer 2221 in the first transistor 410, the second gate dielectric layer 2222 in the second transistor 420, and the gate dielectric layer 222 in the third transistor 430 are different only in composition but not in dimensions, the functional metal gate stack 236 is structurally and dimensionally uniform across the different device regions 1100, 1200, and 1300.

The functional metal gate stack 236 may include one or more work function layer and a metal fill layer. N-type devices and p-type devices may have different work functional layers. In some implementations, while n-type device regions and p-type device regions may share certain common work function layers, n-type device regions may include one or more work function layers that are not present in the p-type device regions. Similarly, in alternative implementations, p-type device regions may include one or more work function layers that are not present in the n-type device regions. P-type work function layer includes any suitable p-type work function material, such as TiN, TaN, TaSN, Ru, Mo, Al, WN, WCN $ZrSi_2$, $MoSi_2$, $TaSi_2$, $NiSi_2$, other p-type work function material, or combinations thereof. N-type work function layer includes any suitable n-type work function material, such as Ti, Al, Ag, Mn, Zr, TiAl, TiAlC, TiAlSiC, TaC, TaCN, TaSiN, TaAl, TaAlC, TaSiAlC, TiAlN, other n-type work function material, or combinations thereof. It is noted that p-type work function layers are not limited to use in p-type device regions and n-type work function layers are not limited to use in n-type device regions. P-type work function layers and n-type work function layers may be applied in n-type device regions and p-type device regions to achieve desired threshold voltage. The metal fill layer may be deposited on n-type work function layer(s) and p-type work function layer(s), such that metal fill layer fills any remaining portion of gate trenches in different device regions. The metal fill layer may include a suitable conductive material, such as aluminum (Al), tungsten (W), ruthenium (Ru), and/or copper (Cu). The metal fill layer may additionally or collectively include other metals, metal nitrides, other suitable materials, or combinations thereof.

The first transistor 410 in the first device region 1100, the second transistor 420 in the second device region 1200, and the third transistor 430 in the third device region have different threshold voltages due to different interface dipoles as a result of use of the first gate dielectric layer 2221, the second gate dielectric layer 2222, and the gate dielectric layer 222. Different metal oxides have different areal density of oxygen atoms. For example, areal densities of oxygen atoms in lanthanum oxide and yttrium oxide are greater than that of silicon oxide while areal densities of oxygen atoms in aluminum oxide and hafnium oxide are greater than that of the silicon oxide. Out of these metal oxides, aluminum oxide has the highest areal density of oxygen atoms. In embodiments where the gate dielectric layer 222 consists essentially of hafnium oxide and the interfacial layer 220 consists essentially of silicon oxide, an interface dipole toward the gate dielectric layer 222 may be formed. When lanthanum or yttrium (having lower areal densities of oxygen atoms than silicon oxide) in the first dipole layer 224 and the second dipole layer 230 is allowed to diffuse into the gate dielectric layer 222, the interface dipole toward the gate dielectric layer may be reduced or reversed. When aluminum (having higher areal densities of oxygen atoms than silicon oxide) in the first dipole layer 224 and the second dipole layer 230 is allowed to diffuse into the gate dielectric layer 222, the interface dipole toward the gate dielectric layer may be increased.

In one embodiment where the first gate dielectric layer 2221 has the first lanthanum concentration (i.e., first lanthanum to hafnium ratio) at about 0.4 ([La]/[Hf]), the second gate dielectric layer 2222 has the second lanthanum concentration (i.e., second lanthanum to hafnium ratio) at about 0.2 ([La]/[Hf]), and the gate dielectric layer 222 has the zero third lanthanum concentration (i.e., third lanthanum to hafnium ratio) at about 0 ([La]/[Hf]), the first transistor 410 has a first threshold voltage (Vt1), the second transistor 420 has a second threshold voltage (Vt2) and the third transistor 430 has a third threshold voltage (Vt3). When the first transistor 410, the second transistor 420, and the third transistor 430 are n-type transistors, Vt1 may be lower than Vt3 by about 150 mV and Vt2 may be lower than Vt3 by about 50 mV. When the first transistor 410, the second transistor 420 and the third transistor 430 are p-type transistors, Vt1 may be greater than Vt3 by about 150 mV and Vt1 may be greater than Vt2 by about 50 mV.

The first transistor 410, the second transistor 420, and the third transistor 430 may be implemented in a static random access memory (SRAM) cell to improve its signal-to-noise margin (SNM) and write margin (WM). For example, the first transistor 410, the second transistor 420, and the third transistor 430 may be implemented in an eight-transistor (8T) SRAM cell 900 shown in FIGS. 29 and 30 or a ten-transistor (10T) SRAM cell 1000 shown in FIGS. 31 and 32.

Figure 29:
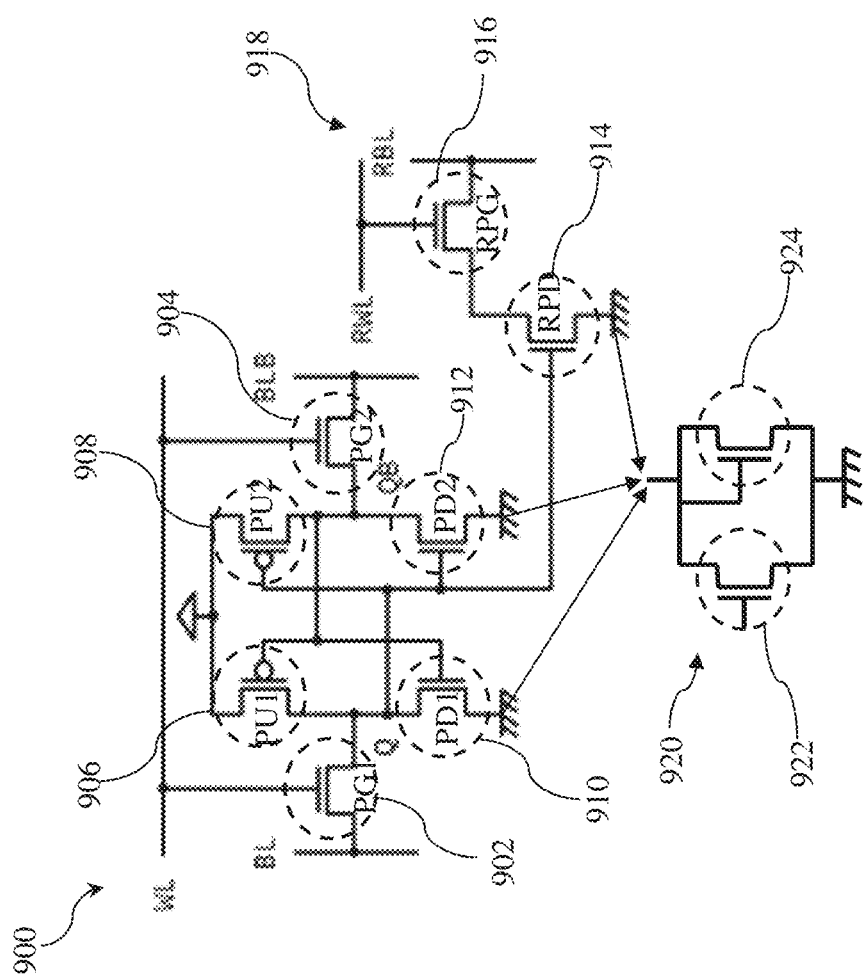
FIG. 29 is a schematic circuit diagram of an 8-transistor (8T) static random access memory (SRAM) cell, according to aspects of the present disclosure.

Reference is first made to a circuit diagram of the 8T SRAM cell 900 shown in FIG. 29. The 8T SRAM cell 900 includes a first pull-up transistor (PU1) 906 and a first pull-down transistor (PD1) 910 forming a first inverter, a second pull-up transistor (PU2) 908 and a second pull-down transistor (PD2) 912 forming a second inverter cross-coupled with the first inverter, a first pass-gate transistor (PG1) 902 and a second pass-gate transistor (PG2) 904 configured to write data to be stored by the cross-coupled first and second inverters. The 8T SRAM cell 900 further includes a read pull-down transistor (RPD) 914 and a read pass-gate transistor (RPG) 916 forming a read port (RP) 918 to access data stored by the cross-coupled first and second inverters. Drain electrodes of the first pull-up transistor (PU1) 906, the first pull-down transistor (PD1) 910, and the first pass-gate transistor (PG1) 902 are electrically connected at a first data storage node Q. Drain electrodes of the second pull-up transistor (PU2) 908, the second pull-down transistor (PD2) 912, and the second pass-gate transistor (PG2) 904 are electrically connected at a second data storage node QB. Gate electrodes of the second pull-up transistor (PU2) 908 and the second pull-down transistor (PD2) 912 are electrically connected to the drain electrodes of the first pull-down transistor (PD1) 910, the first pass-gate transistor (PG1) 902, and the first pull-up transistor (PU1) 906 through the first data storage node Q, while gate electrodes of the first pull-up transistor (PU1) 906 and the first pull-down transistor (PD1) 910 are electrically connected to the drain electrodes of the second pull-down transistor (PD2) 912, the second pass-gate transistor (PG2) 904, and the second pull-up transistor (PU2) 908 through the second data storage node QB. Source electrodes of the first pull-down transistor (PD1) 910, second pull-down transistors (PD2) 912 and the read pull-down transistor (RPD) are connected to a first power supply node Vss, while source electrodes of the first and second pull-up transistors (PU1) 906 and (PU2) 908 are connected to a second power supply node Vdd. According to one embodiment, the first power supply node Vss is electrically connected to a virtual ground 920, and the second power supply node Vdd is electrically connected to a positive electrical potential, supplied from a power supply circuit (not shown) of the SRAM. In some implementations, the virtual ground 920 includes a hold transistor 922 and a power gate transistor 924.

Figure 30:
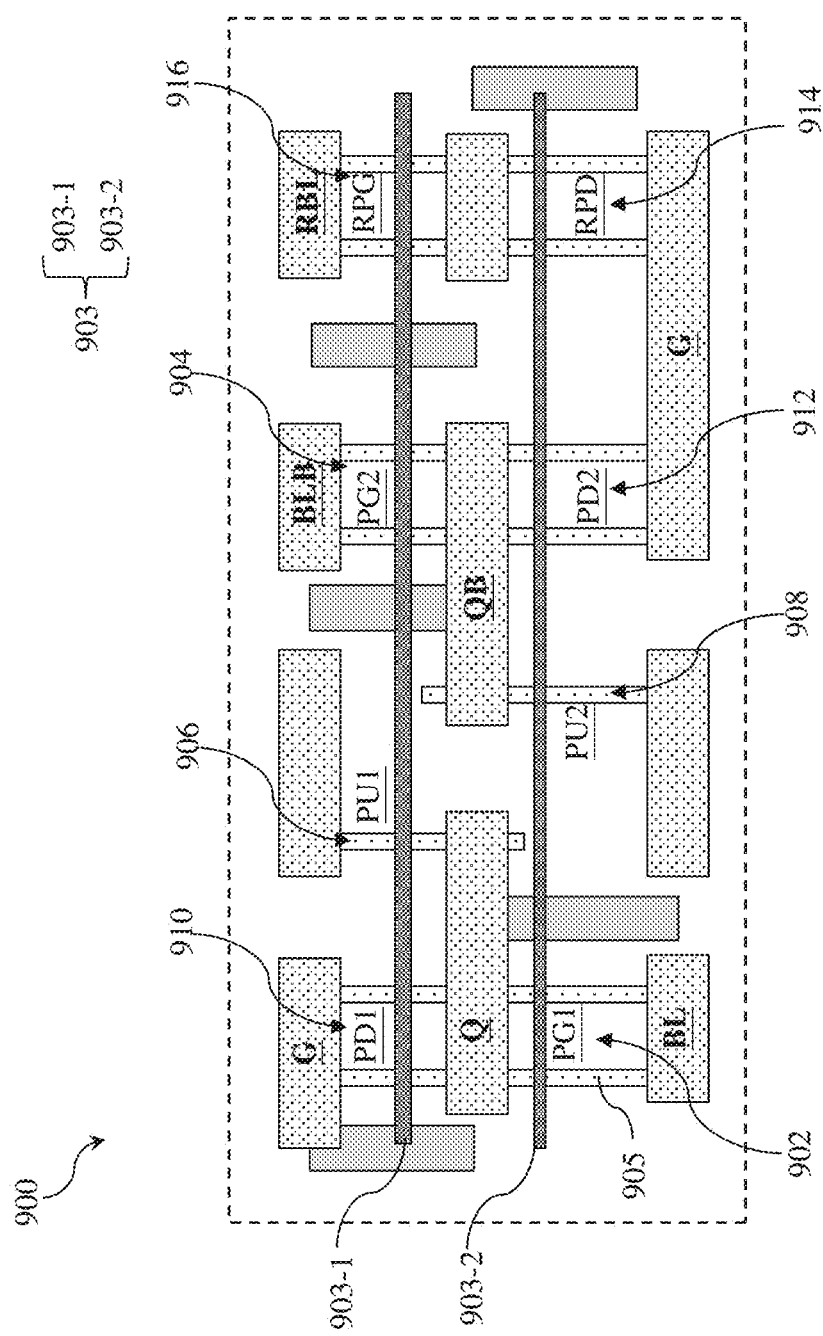
FIG. 30 is a schematic layout of the 8T SRAM cell in FIG. 29, according to aspects of the present disclosure.

The circuit diagram in FIG. 29 may be implemented in a layout of the 8T SRAM cell 900 shown in FIG. 30. In some implementations, each of the first pass-gate transistor (PG1) 902, the second pass-gate transistor (PG2) 904, the first pull-down transistor (PD1) 910, the second pull-down transistor (PD2) 912, the read pull-down transistor (RPD) 914, and the read pass-gate transistor (RPG) 916 includes a gate structure 903 disposed over two active regions 905. Each of the first pull-up transistor (PU1) 906 and the second pull-up transistor (PU2) 908 includes a gate structure 903 (including a first gate structure 903-1 and a second gate structure 903-2) disposed over a single active region 905. In instances where the active regions are fin-shaped, the former may be referred to as double-fin devices and the latter may be referred to as single-fin devices.

In an embodiment, the power gate transistor 924 may be a first transistor 410. As the first transistor 410 has the highest threshold voltage (the first threshold voltage, Vt1) among the first transistor 410, the second transistor 420, and the third transistor 430, it has the smallest leakage current and may reduce leakage at the power gate transistor 924. In the same embodiment, the read port (RP) 918 may be formed of the third transistor 430. As the third transistor 430 has the lowest threshold voltage (the third threshold voltage, Vt3) among the first transistor 410, the second transistor 420, and the third transistor 430, it has the highest switching speed and may improve read speed of the 8T SRAM cell 900. In the same embodiment, the second transistor 420, which has the median threshold voltage level (the second threshold voltage Vt2), may be applied to each of the first pass-gate transistor (PG1) 902, the second pass-gate transistor (PG2) 904, the first pull-down transistor (PD1) 910, and the second pull-down transistor (PD2) 912 to have balanced SNMs. As the first gate structure 903-1 is shared among the first pull-down transistor (PD1) 910, the second pass-gate transistor (PG2) 904, and the read pass-gate transistor (RPG) 916, the first gate structure 903-1 is shared among two second transistors 420 (implemented as PD1 and PG1) and one third transistor 430 (implemented as RPG). Similarly, as the second gate structure 903-2 is shared among the first pass-gate transistor (PG1) 902, the second pull-down transistor (PD2) 912, and the read pull-down transistor (RPD) 914, the second gate structure 903-2 is shared among two second transistors 420 (implemented as PD2 and PG2) and one third transistor 430 (implemented as RPD). As used herein, a gate structure is referred to as being shared by or multiple transistors as its functional metal gate stack extend over these transistors. Reference is made to FIG. 15. While the first transistor 410, the second transistor 420, and the third transistor 430 have different gate dielectric layers, they may have a common functional metal gate stack 236. The common functional metal gate stack 236 allows transistors of the present disclosure to be shared among more than one transistor.

Figure 31:
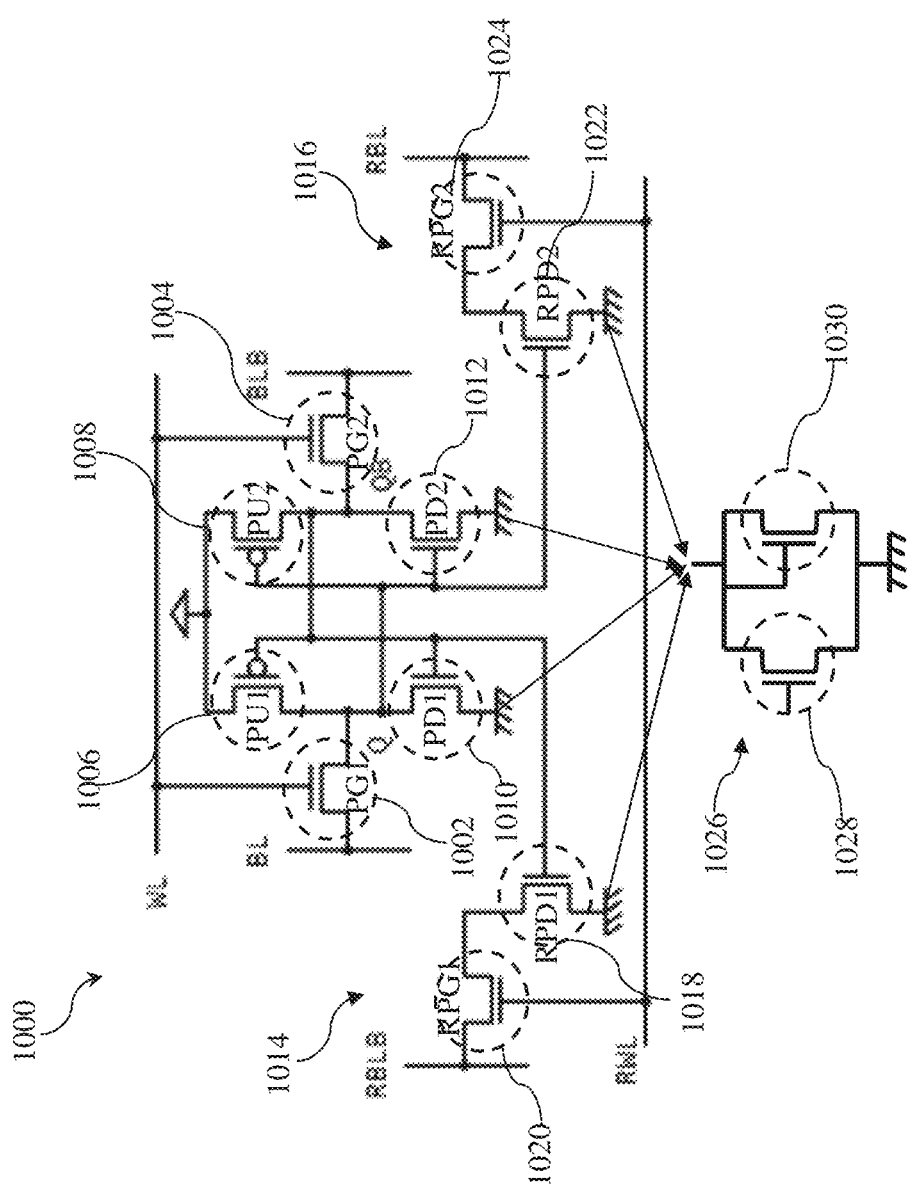
FIG. 31 is a schematic circuit diagram of a 10-transistor (10T) SRAM cell, according to aspects of the present disclosure.

Reference is then made to a circuit diagram of the 10T SRAM cell 1000 shown in FIG. 31. The 10T SRAM cell 1000 includes a first pull-up transistor (PU1) 1006 and a first pull-down transistor (PD1) 1010 forming a first inverter, a second pull-up transistor (PU2) 1008 and a second pull-down transistor (PD2) 1012 forming a second inverter cross-coupled with the first inverter, a first pass-gate transistor (PG1) 1002 and a second pass-gate transistor (PG2) 1004 configured to write data to be stored by the cross-coupled first and second inverters. The 10T SRAM cell 1000 further includes a first read port (RP1) 1014 and a second read port (RP) 1016 to access data stored by the cross-coupled first and second inverters. The first read port (RP) 1014 includes a first read pull-down transistor (RPD1) 1018 and a first read pass-gate transistor (RPG1) 1020 and the second read port (RP2) 1016 includes a second read pull-down transistor (RPD2) 1022 and a second read pass-gate transistor (RPG2) 1024. Drain electrodes of the first pull-up transistor (PU1) 1006, the first pull-down transistor (PD1) 1010, and the first pass-gate transistor (PG1) 1002 are electrically connected at a first data storage node Q. Drain electrodes of the second pull-up transistor (PU2) 1008, the second pull-down transistor (PD2) 1012, and the second pass-gate transistor (PG2) 1004 are electrically connected at a second data storage node QB. Gate electrodes of the second pull-up transistor (PU2) 1008 and the second pull-down transistor (PD2) 1012 are electrically connected to the drain electrodes of the first pull-down transistor (PD1) 1010, the first pass-gate transistor (PG1) 1002, and the first pull-up transistor (PU1) 1006 through the first data storage node Q, while gate electrodes of the first pull-up transistor (PU1)

1006 and the first pull-down transistor (PD1) 1010 are electrically connected to the drain electrodes of the second pull-down transistor (PD2) 1012, the second pass-gate transistor (PG2) 1004, and the second pull-up transistor (PU2) 1008 through the second data storage node QB. Source electrodes of the first pull-down transistor (PD1) 1010, the second pull-down transistor (PD2) 1012, the first read pull-down transistor (RPD1) 1018, and the second read pull-down transistor (RPD2) 1022 are connected to a first power supply node Vss, while source electrodes of the first and second pull-up transistors (PU1) 1006 and (PU2) 1008 are connected to a second power supply node Vdd. According to one embodiment, the first power supply node Vss is electrically connected to a virtual ground 1026, and the second power supply node Vdd is electrically connected to a positive electrical potential, supplied from a power supply circuit (not shown) of the SRAM. In some implementations, the virtual ground 1026 includes a hold transistor 1028 and a power gate transistor 1030.

Figure 32:
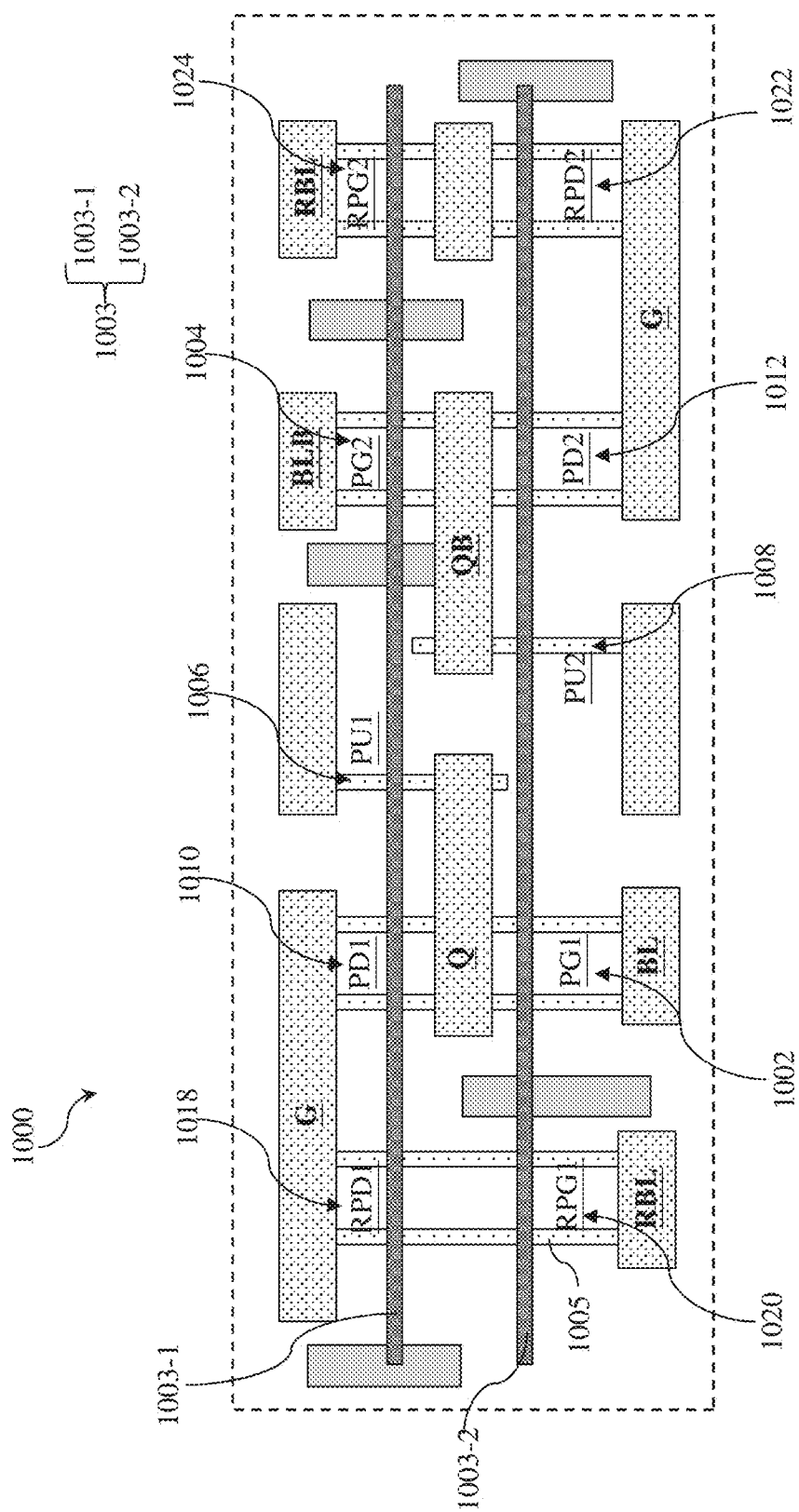
FIG. 32 is a schematic layout of the 10T SRAM cell in FIG. 31, according to aspects of the present disclosure.

The circuit diagram in FIG. 31 may be implemented in a layout of the 10T SRAM cell 1000 shown in FIG. 32. In some implementations, each of the first pass-gate transistor (PG1) 1002, the second pass-gate transistor (PG2) 1004, the first pull-down transistor (PD1) 1010, the second pull-down transistor (PD2) 1012, the first read pull-down transistor (RPD1) 1018, the first read pass-gate transistor (RPG1) 1020, the second read pull-down transistor (RPD2) 1022, the second read pass-gate transistor (RPG2) 1024 includes a gate structure 1003 disposed over two active regions 1005. Each of the first pull-up transistor (PU1) 1006 and the second pull-up transistor (PU2) 1008 includes a gate structure 1003 (including a first gate structure 1003-1 and a second gate structure 1003-2) disposed over a single active region 1005. In instances where the active regions are fin-shaped, the former may be referred to as double-fin devices and the latter may be referred to as single-fin devices.

Figure 28A:
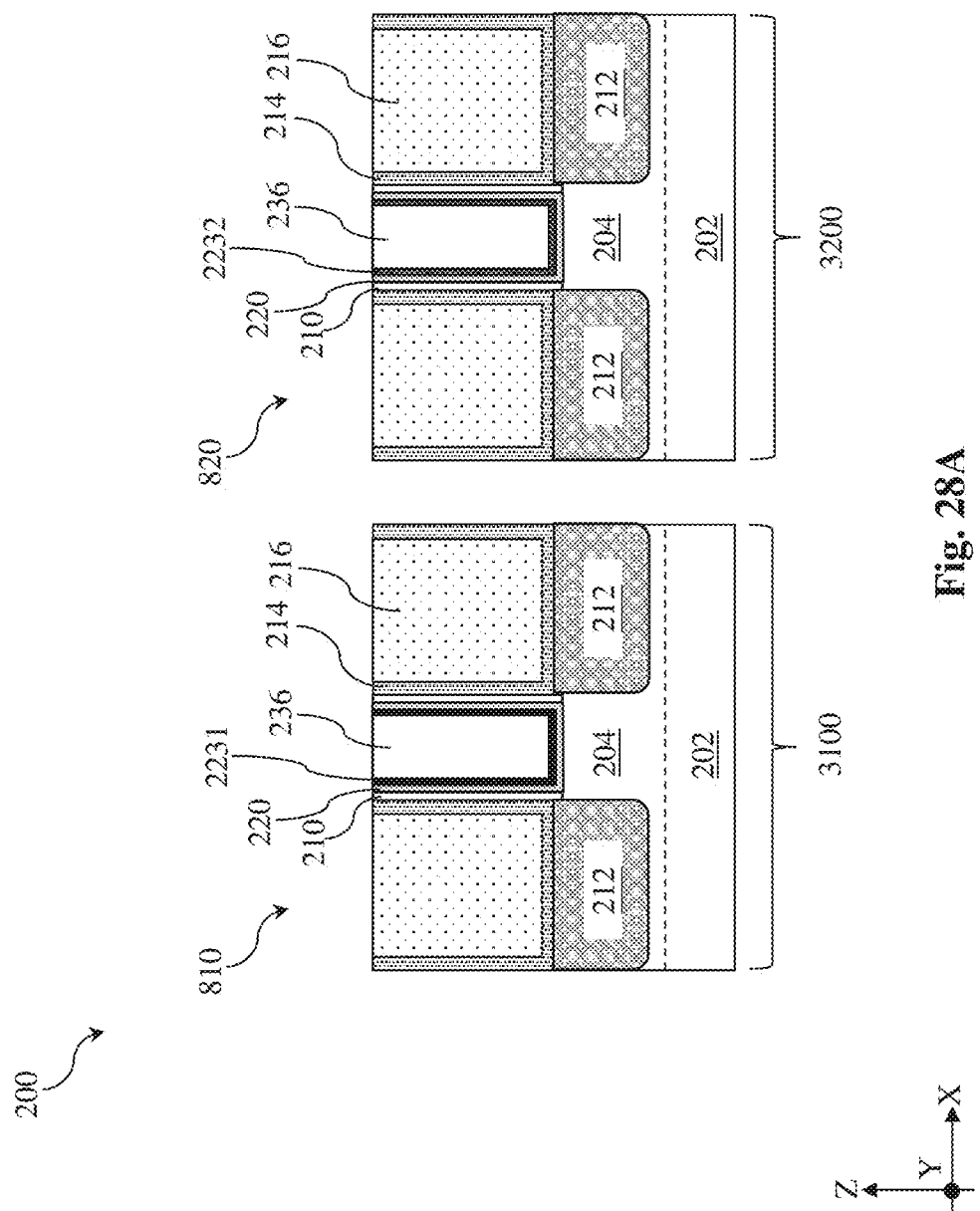
Figure 28B:
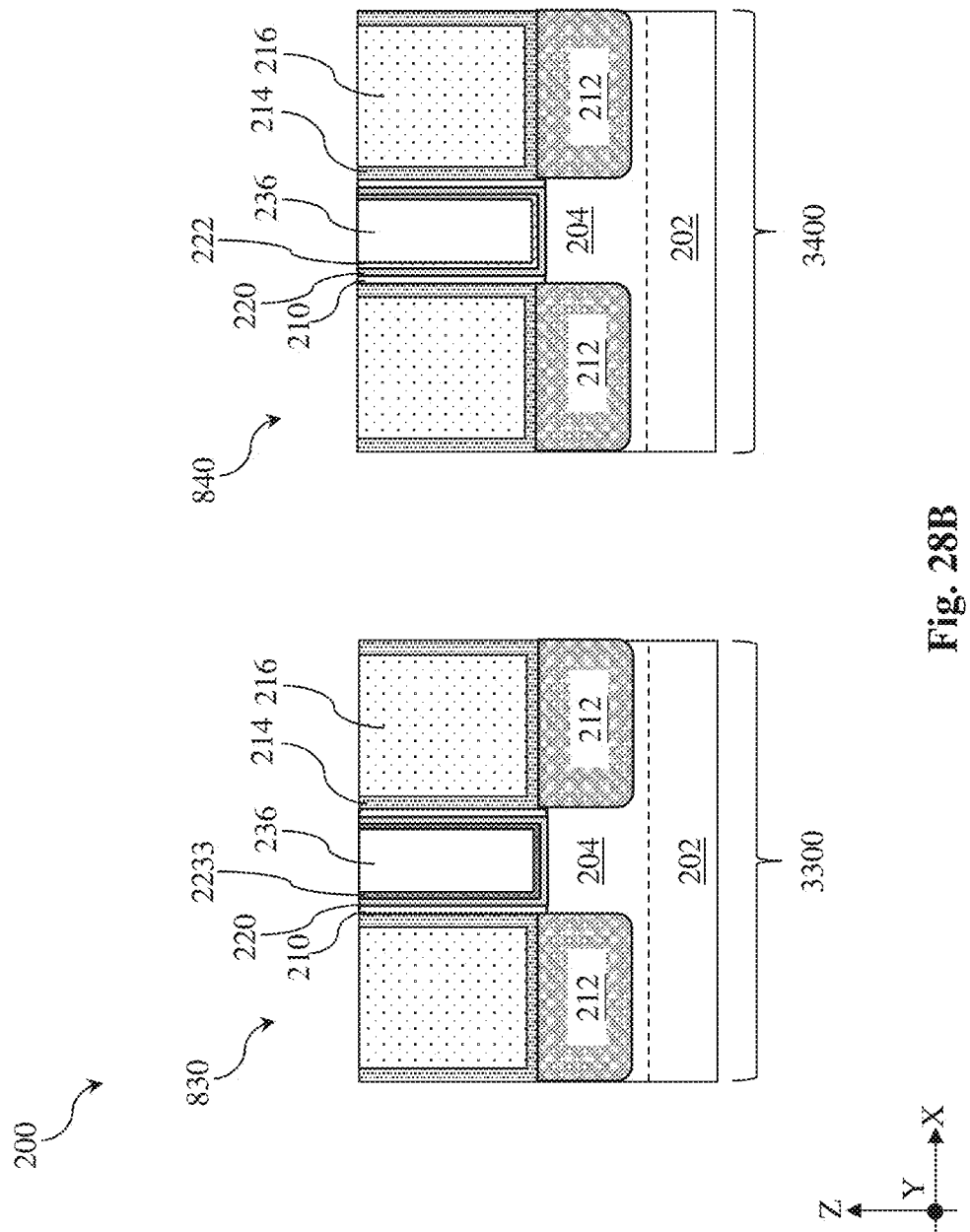

In an embodiment, the power gate transistor 1030 may be a first transistor 410. As the first transistor 410 has the highest threshold voltage (the first threshold voltage, Vt1) among the first transistor 410, the second transistor 420, and the third transistor 430, it has the smallest leakage current and may reduce leakage at the power gate transistor 1030. In the same embodiment, the first read port (RP1) 1014 and the second read port (RP2) 1016 may be formed of the third transistor 430. As the third transistor 430 has the lowest threshold voltage (the third threshold voltage, Vt3) among the first transistor 410, the second transistor 420, and the third transistor 430, it has the highest switching speed and may improve read speed of the 10T SRAM cell 1000. In the same embodiment, the second transistor 420, which has the median threshold voltage level (the second threshold voltage Vt2), may be applied to each of the first pass-gate transistor (PG1) 1002, the second pass-gate transistor (PG-2) 1004, the first pull-down transistor (PD1) 1010, and the second pull-down transistor (PD2) 1012 to have balanced SNMs. As the first gate structure 1003-1 is shared among first read pull-down transistor (RPD1) 1018, the first pull-down transistor (PD1) 1010, the second pass-gate transistor (PG2) 1004, and the second read pass-gate transistor (RPG2) 1024, the first gate structure 1003-1 is shared among two second transistors 420 (implemented as PD1 and PG1) and two third transistors 430 (implemented as RPD1 and RPG2). Similarly, as the second gate structure 1003-2 is shared among first read pass-gate transistor (RPG1) 1020, the first pass-gate transistor (PG1) 1002, the second pull-down transistor (PD2) 1012, and the second read pull-down transistor (RPD2) 1022, the second gate structure 1003-2 is shared among two second transistors 420 (implemented as PD2 and PG2) and two third transistor 430 (implemented as RPG1 and RPD2). As described above, a gate structure is referred to as being shared by or multiple transistors as its functional metal gate stack extend over these transistors. Reference is made to FIGS. 28A and 28B. While the first transistor 810, the second transistor 820, the third transistor 830, and the fourth transistor 840 have different gate dielectric layers, they may have a common functional metal gate stack 236. The common functional metal gate stack 236 allows transistors of the present disclosure to be shared among more than one transistor.

Figure 16:
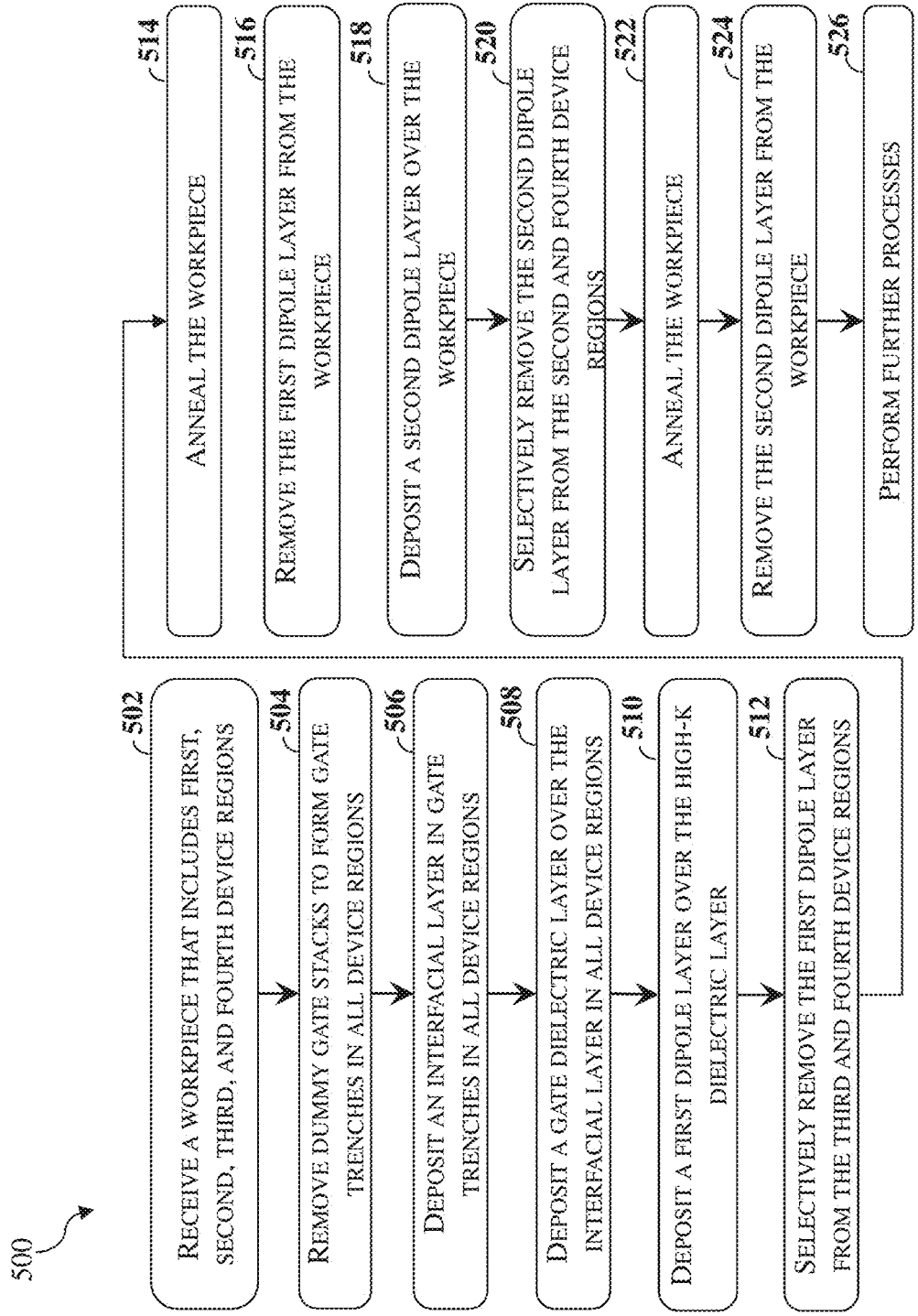
FIG. 16 illustrates a flowchart of another method of forming a semiconductor device, according to aspects of the present disclosure.

FIG. 16 illustrates a flow chart of a method 500 for forming a semiconductor device according to various aspects of the present disclosure. FIGS. 2-5, 17-27, 28A and 28B are fragmentary cross-sectional views of a workpiece 200 at various stages of fabrication of the method 500 in FIG. 16. Additional steps can be provided before, during, and after method 500, and some of the steps described can be moved, replaced, or eliminated for additional embodiments of method 500. Additional features can be added in the contact structure depicted in FIGS. 2-5, 17-27, 28A and 28B, and some of the features described below can be replaced, modified, or eliminated in other embodiments of the interconnect structure depicted in FIGS. 2-5, 17-27, 28A and 28B.

Referring to FIGS. 16 and 2, the method 500 includes a block 502 where a workpiece 200 is received. As operations at block 502 are similar to those at block 102 described above, descriptions thereof will not be repeated. In addition, detailed descriptions of the workpiece 200 and various features thereon have been described above and are also omitted here for brevity.

Referring to FIGS. 16 and 3, the method 500 includes a block 504 where the dummy gate stack 208 is removed to form a gate trench 218. As operations at block 504 are similar to those at block 104 described above, descriptions thereof will not be repeated. In addition, detailed descriptions of the dummy gate stack 208 and the gate trench 218 have been described above and are also omitted here for brevity.

Referring to FIGS. 16 and 4, the method 500 includes a block 506 where an interfacial layer 220 is deposited in the gate trench 218. As operations at block 506 are similar to those at block 106 described above, descriptions thereof will not be repeated. In addition, detailed descriptions of the interfacial layer 220 have been described above and are also omitted here for brevity.

Referring to FIGS. 16 and 5, the method 500 includes a block 508 where a gate dielectric layer 222 is deposited over the interfacial layer 220. As operations at block 508 are similar to those at block 108 described above, descriptions thereof will not be repeated. In addition, detailed descriptions of the gate dielectric layer 222 have been described above and are also omitted here for brevity.

As will be described below, the workpiece 200 may include multiple device regions (such as three device regions, four device regions, or more device regions) for transistors having different threshold voltages and the structure shown in FIGS. 2-5 may be repeated across these multiple device regions but the repeated structures are omitted, which is representatively shown by ellipses (" . . . ") in FIGS. 2-5. Operations of the method 500 that treat different device regions differently will be described below in conjunction with FIGS. 17-27, 28A and 28B. For simplicity and clarity of descriptions, FIGS. 17-27 illustrate fragmentary cross-sectional views of area "I" in different device regions.

Referring to FIGS. 16 and 6, the method 500 includes a block 510 where a first dipole layer 224 is deposited over the gate dielectric layer 222. In the embodiments illustrated in FIGS. 17-27, 28A and 28B, the workpiece 200 includes four device regions—a first device region 3100, a second device region 3200, a third device region 3300, and a fourth device region 3400. As described above, FIG. 17 illustrates the fragmentary cross-sectional views of the area "I" in the first device region 3100, the second device region 3200, the third device region 3300, and the fourth device region 3400. The first dipole layer 224 is deposited on the gate dielectric layer 222 in the gate trenches in the first device region 3100, the second device region 3200, the third device region 3300, and the fourth device region 3400. In some embodiments, the first dipole layer 224 may be formed of lanthanum oxide, yttrium oxide, or aluminum oxide and may be deposited using atomic layer deposition (ALD). In some implementations, the ALD process used to form the first dipole layer 224 may include between about 2 and about 10 cycles. In those implementations, the first dipole layer 224 may have a thickness between about 1 Å and about 10 Å. In one embodiment, the first dipole layer 224 may be formed of lanthanum oxide.

Figure 18:
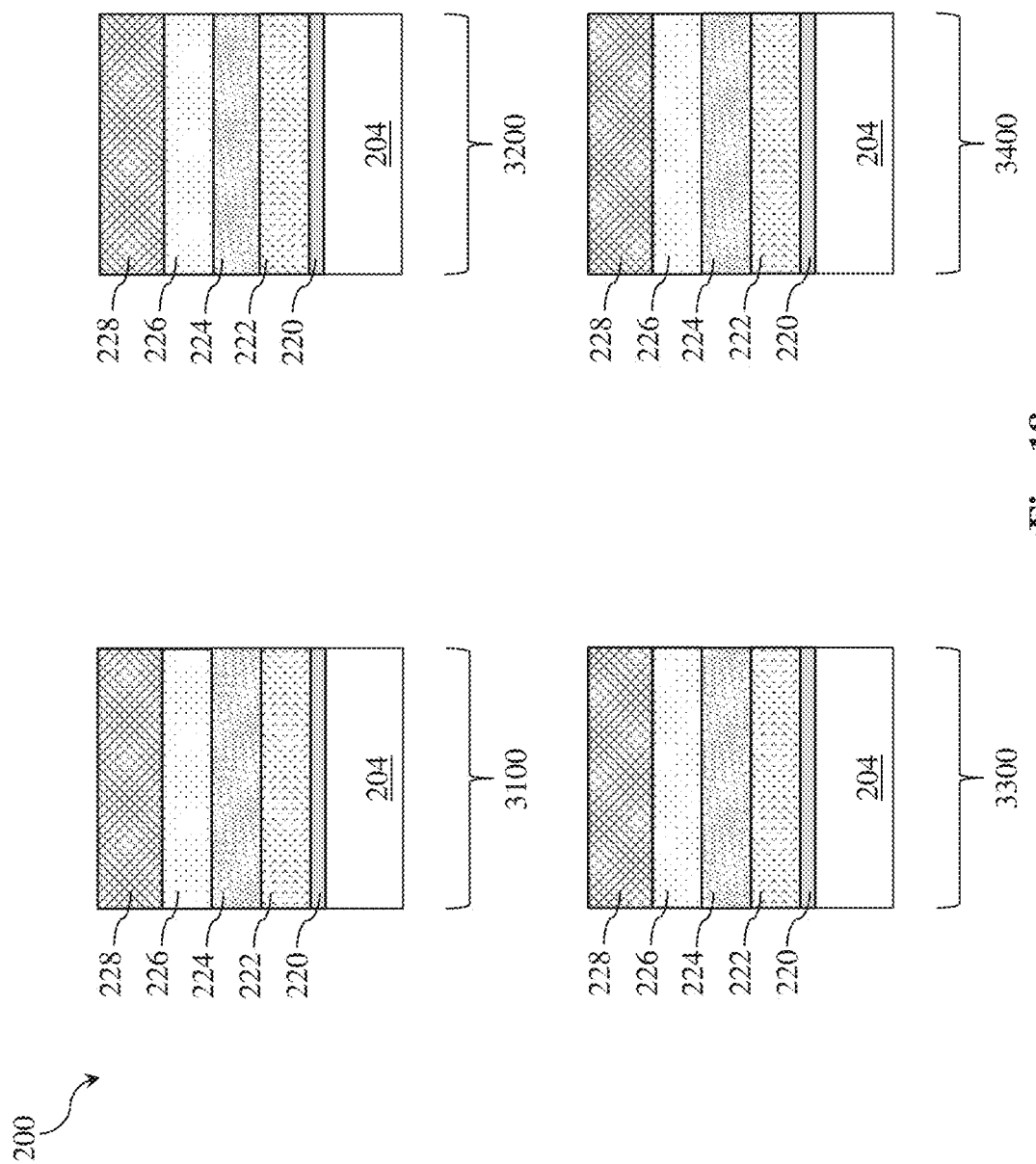
Figure 19:
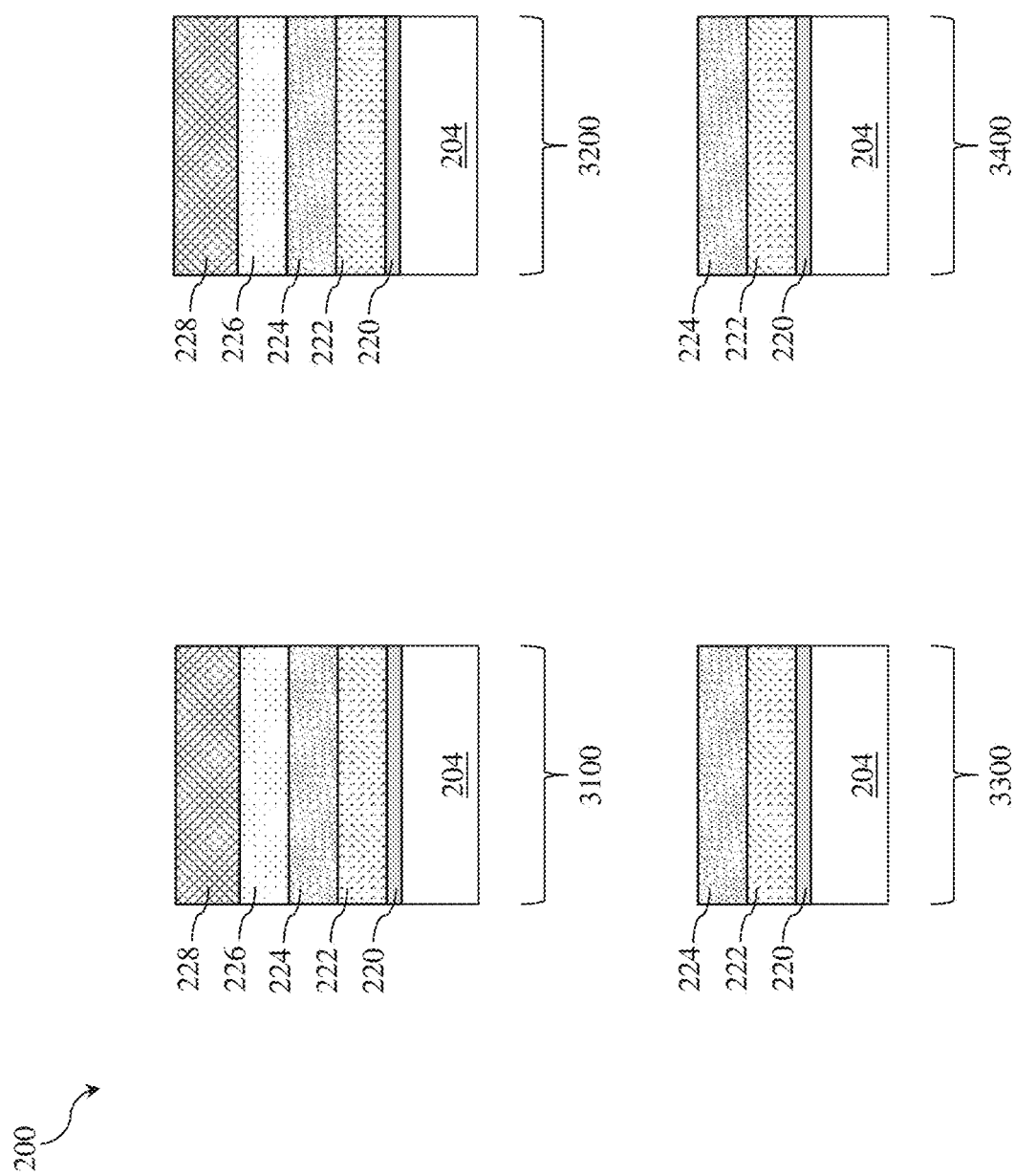
Figure 20:
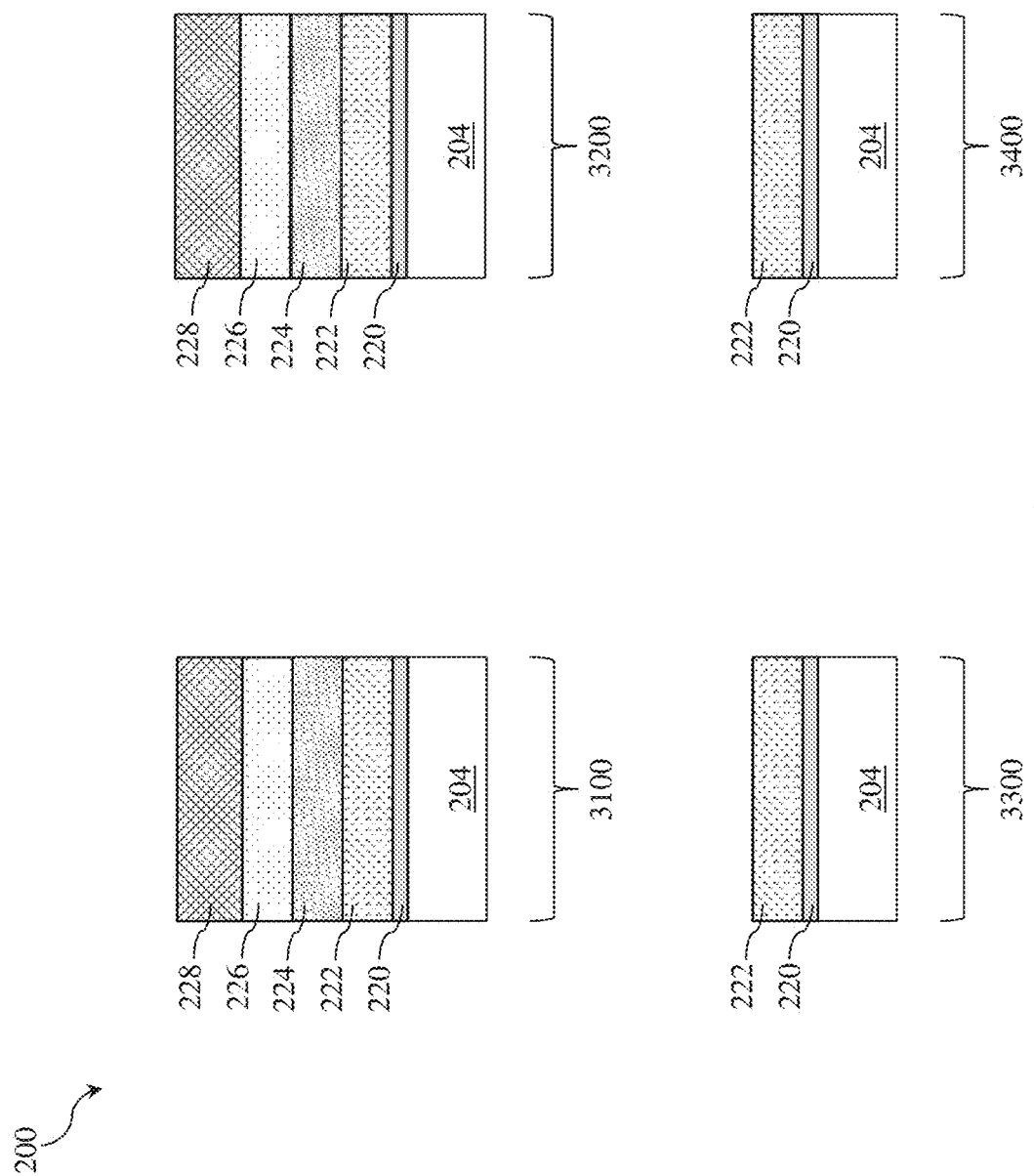

Referring to FIGS. 16, 18, 19, and 20, the method 500 includes a block 512 where the first dipole layer 224 is selectively removed from the third device region 3300 and the fourth device region 3400. In some embodiments, photolithography techniques and etch techniques may be used to perform the operations at block 512. An example process is shown in FIGS. 18-20. Reference is first made to FIG. 18. A hard mask layer 226 is first formed over the first dipole layer 224 and a bottom antireflective coating (BARC) layer 228 is deposited over the hard mask layer 226. In some instances, the hard mask layer 226 may be a single layer or a multi-layer. When the hard mask layer 226 is a single layer, the hard mask layer 226 may include silicon oxide, silicon nitride, or silicon oxynitride. When the hard mask layer 226 is a multi-layer, the hard mask layer 226 may include a silicon layer and a silicon nitride layer on the silicon layer. The BARC layer 228 may include silicon oxynitride, a polymer, or a suitable material. To pattern the BARC layer 228 and the hard mask layer 226, a photoresist layer may be blanketly deposited over the workpiece 200, including over the BARC layer 228 in the first device region 3100, the second device region 3200, the third device region 3300, and the fourth device region 3400. The photoresist layer may be a single layer or a multi-layer, such as a tri-layer. The photoresist layer is then exposed to radiation going through or reflected from a mask, baked in a post-bake process, and developed in a developer solution to form a patterned photoresist mask. The BARC layer 228 and the hard mask layer 226 are then patterned using the patterned photoresist mask to form an etch mask having openings over the third device region 3300 and the fourth device region 3400. The etch mask is then used in an etch process to selectively etch away the first dipole layer 224 in the gate trench in the third device region 3300 and the fourth device region 3400, as illustrated in FIG. 19. The etch process may be a dry etch process, a wet etch process, or a suitable etch process. Referring to FIG. 20, after the first dipole layer 224 is selectively removed from the gate trench in the third device region 3300 and the fourth device region 3400, the hard mask layer 226 and the BARC layer 228 in the first device region 3100 and the second device region 3200 are removed using a suitable etching process.

Figure 21:
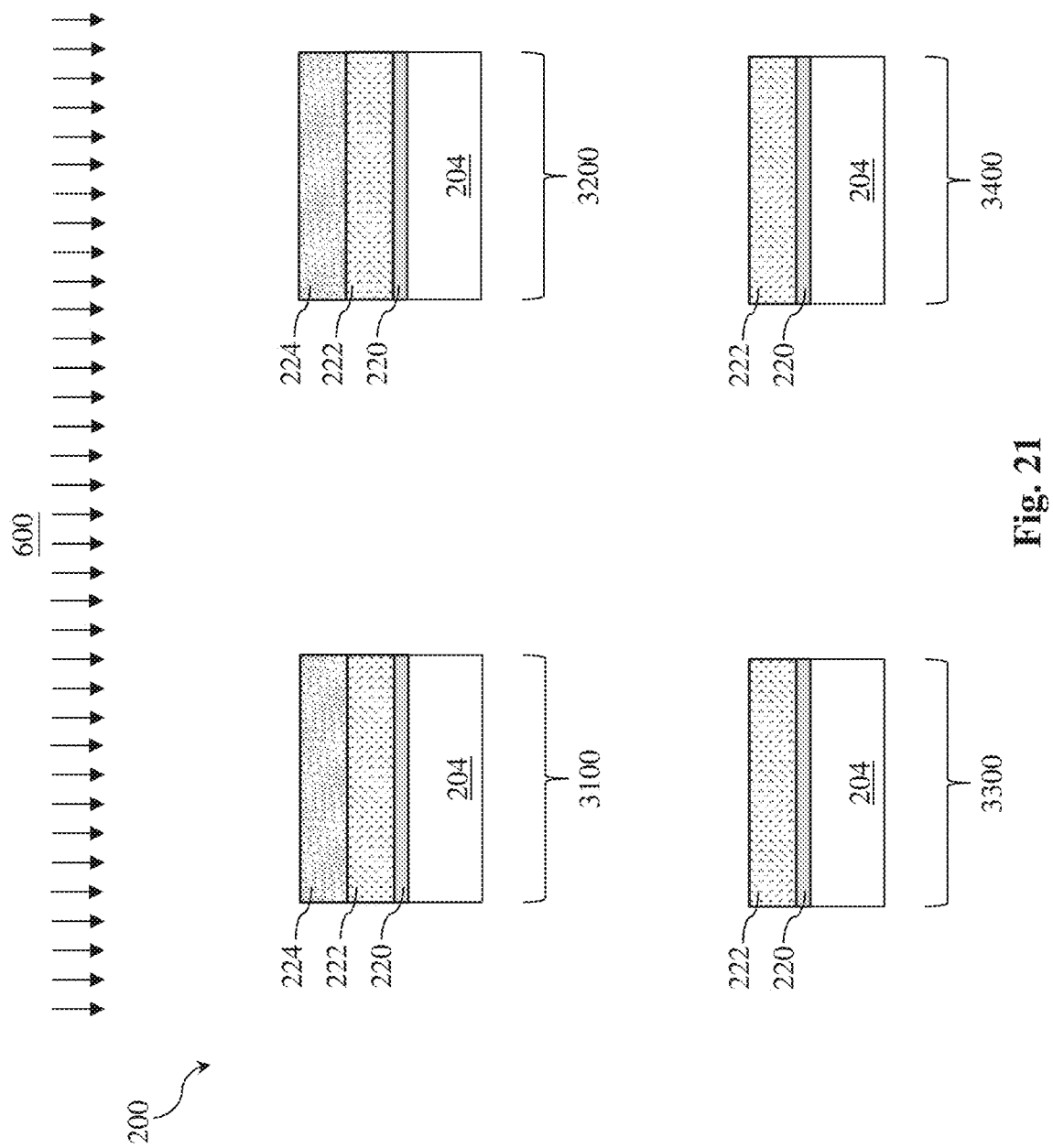
Figure 22:
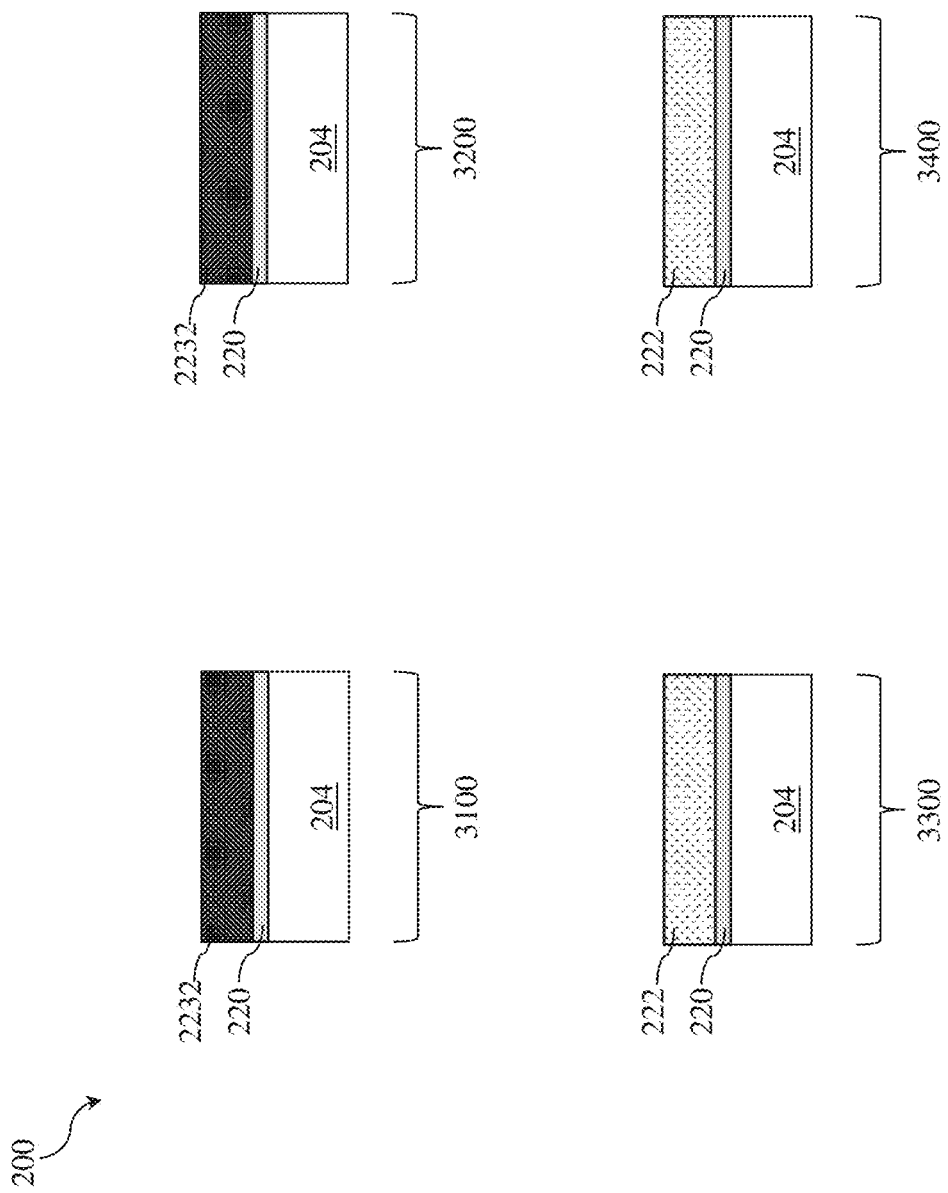

Referring to FIGS. 16 and 21, the method 500 includes a block 514 where a first anneal process 600 is performed to anneal the workpiece 200. At block 514, the first anneal process 600 is used to thermally drive elements in the first dipole layer 224 into the gate dielectric layer 222 in the gate trenches in the first device region 3100 and the second device region 3200. The first dipole layer 224 serves as a diffusion doping vehicle to bring its elements to be in direct contact with the gate dielectric layer 222 in the first device region 3100 and the second device region 3200. The first anneal process 600 may be a rapid thermal anneal (RTA) process, a laser spike anneal process, a flash anneal process, or a furnace anneal process. In some implementation, the first anneal process 600 includes a high anneal temperature between about 500° C. and about 900° C. so as to allow lanthanum, yttrium, or aluminum in the first dipole layer 224 to diffuse into the gate dielectric layer 222 in gate trenches in the first device region 3100 and the second device region 3200. Because the gate trenches in the third device region 3300 and the fourth device region 3400 are free of the first dipole layer 224, the first anneal process 600 at block 514 does not result in any dipole layer material diffusing into the gate dielectric layer 222 in the third device region 3300 and the fourth device region 3400. In some implementations, the first anneal process 600 may last between about 5 seconds and about 20 seconds. As shown in FIG. 22, after the first anneal process 600 at block 514, elements in the first dipole layer 224 diffuse into the gate dielectric layers 222 to form the second gate dielectric layer 2232 in gate trenches in the first device region 3100 and the second device region 3200.

Referring to FIGS. 16 and 22, the method 500 includes a block 516 where the first dipole layer 224 is selectively removed from the workpiece 200. In some embodiments, photolithography and etch techniques may be used at block 516 to prevent damages to the gate dielectric layer 222 in the third device region 3300 and the fourth device region 3400. For example, a hard mask layer, a BARC layer, and a photoresist layer may be deposited over the workpiece 200. The photoresist layer, the BARC layer, and the hard mask layer are then patterned to form an etch mask that expose the first dipole layer 224 in the gate trenches in the first device region 3100 and the second device region 3200. The first dipole layer 224 is then etched by a dry etch process, a wet etch process, or a suitable etch process using the etch mask. The etch mask, which is formed of the hard mask layer and the BARC layer, is then removed. At the conclusion of block 516, the second gate dielectric layer 2232 in the gate trenches in the first device region 3100 and the second device region 3200 and the gate dielectric layer 222 in the gate trenches in the third device region 3300 and the fourth device region 3400 are exposed.

Figure 23:
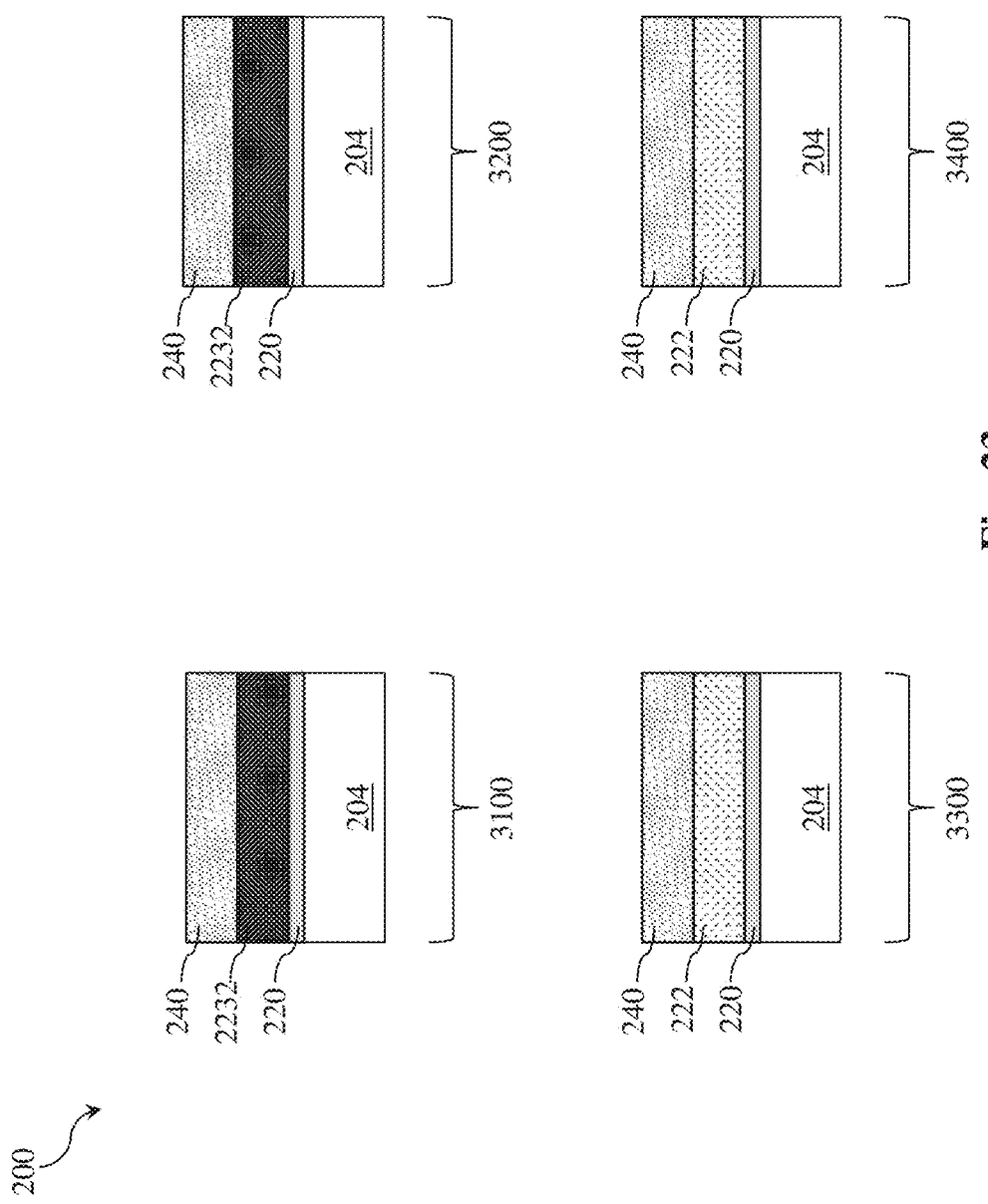

Referring to FIGS. 16 and 23, the method 500 includes a block 518 where a second dipole layer 240 is deposited over the workpiece 200. As shown in FIG. 23, the second dipole layer 240 is deposited on the second gate dielectric layer 2232 in the gate trenches in the first device region 3100 and the second device region 3200 as well as on the gate dielectric layer 222 in the gate trenches in the third device region 3300 and the fourth device region 3400. In some embodiments, the second dipole layer 240 and the first dipole layer 224 may have the same composition. Similar to the first dipole layer 224, the second dipole layer 240 may also be formed of lanthanum oxide, yttrium oxide, or aluminum oxide and may be deposited using atomic layer deposition (ALD). In some implementations, the ALD process used to form the second dipole layer 240 may include between about 2 and about 5 cycles. In those implementations, the second dipole layer 240 may have a thickness between about 1 Å and about 5 Å. In one embodiment, the second dipole layer 240 may be formed of lanthanum oxide. Different from the second dipole layer 230 in the embodiments illustrated in FIGS. 2-15, the second dipole layer 240 in the embodiments illustrated in FIGS. 17-27, 28A and 28B are thinner. The second dipole layer 240, with a thickness between about 1 Å and about 5 Å, is thinner than the first dipole layer 224, which has a thickness between about 1 Å and about 10 Å.

Figure 24:
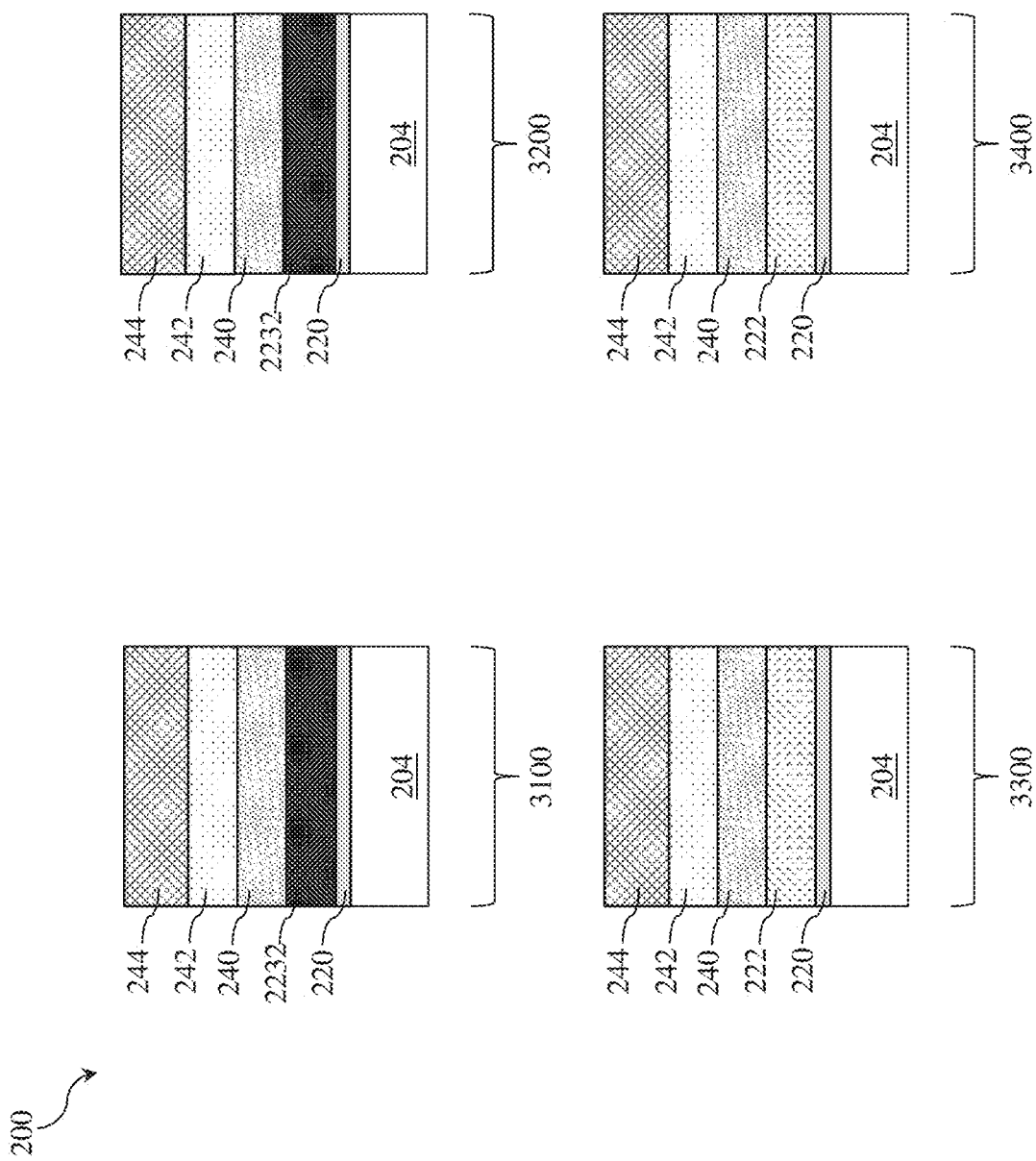
Figure 25:
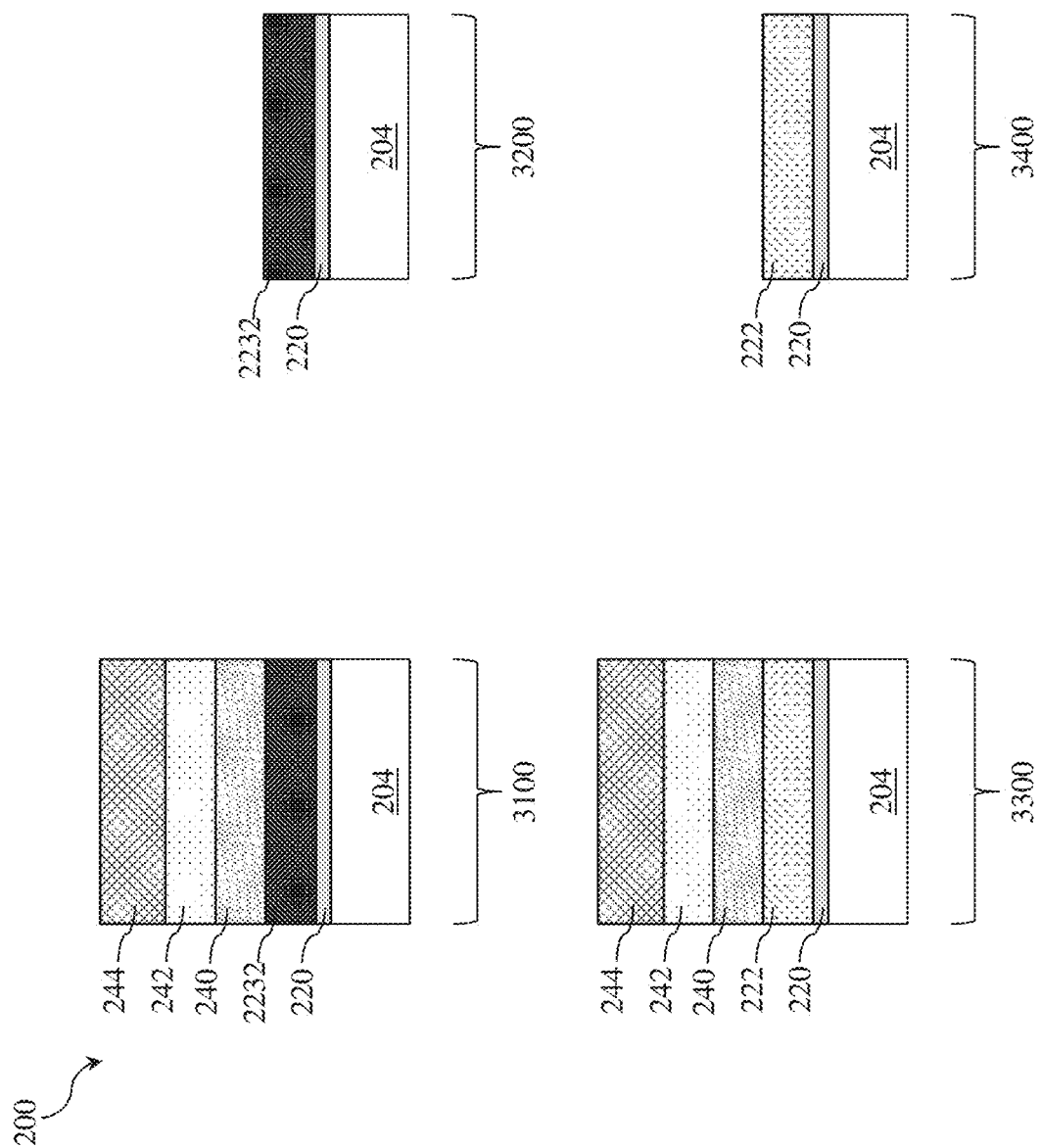
Figure 26:
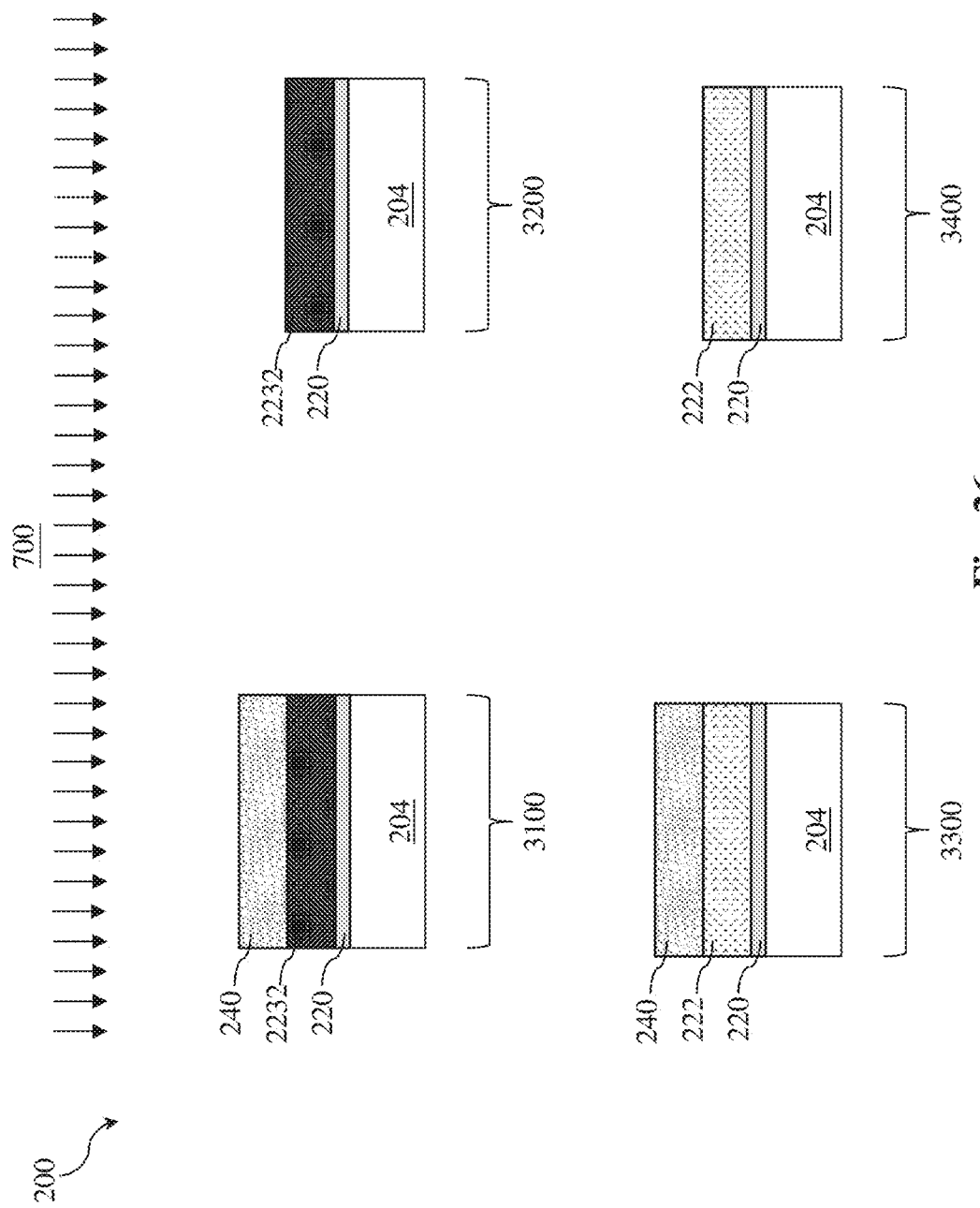

Referring to FIGS. 16, 24, 25, and 26, the method 500 includes a block 520 where the second dipole layer 240 is selectively removed from the gate trenches in the second device region 3200 and the fourth device region 3400. Similar to operations at block 112 in method 100, operations at block 520 may also be performed using photolithography and etch techniques. For example, a hard mask layer 242 and a BARC layer 244 may be formed over the second dipole layer 240, as shown in FIG. 24. As the hard mask layer 242 may be similar to the hard mask layer 226 and the BARC layer 244 may be similar to the BARC layer 228, detailed descriptions of the hard mask layer 242 and the BARC layer 244 are omitted for brevity. Thereafter a photoresist layer may then be deposited over the BARC layer 244. The photoresist layer, the BARC layer 244, and the hard mask layer 242 are then patterned in fashions similar to those described with respect to block 112 of method 100 and will not be repeated here. The patterned hard mask layer 242 allows selective removal of the second dipole layer 240 in the gate trenches in the second device region 3200 and the fourth device region 3400, exposing the second gate dielectric layer 2232 in the second device region 3200 and gate dielectric layer 222 in the fourth device region 3400. As illustrated in FIG. 25, at this point, the gate trench in the first device region 3100 includes thereover the second gate dielectric layer 2232 and the second dipole layer 240; the gate trench in the second device region 3200 includes thereover the second gate dielectric layer 2232; the gate trench in the third device region 3300 includes thereover the second dipole layer 240; and the gate trench in the fourth device region 3400 includes the gate dielectric layer 222 uncovered by any dipole layer. After the second dipole layer 240 is selectively removed from the gate trenches in the second device region 3200 and the fourth device region 3400, the hard mask layer 242 and the BARC layer 244 may then be removed from the first device region 3100 and the third device region 3300, as illustrated in FIG. 26.

Referring to FIGS. 16 and 26, the method 500 includes a block 522 where the workpiece 200 is annealed in a second anneal process 700. At block 522, the second anneal process 700 is used to thermally drive elements in the second dipole layer 240 into the second gate dielectric layer 2232 in the gate trench in the first device region 3100 and into the gate dielectric layer 222 in the gate trench in the third device region 3300. The second dipole layer 240 serves as a diffusion doping vehicle to bring its elements to be in direct contact with the second gate dielectric layer 2232 and the gate dielectric layer 222. The second anneal process 700 may be a rapid thermal anneal (RTA) process, a laser spike anneal process, a flash anneal process, or a furnace anneal process. In some implementation, the second anneal process 700 includes a high anneal temperature between about 500° C. and about 900° C. so as to allow lanthanum, yttrium, or aluminum in the second dipole layer 240 to diffuse into the second gate dielectric layer 2232 in gate trench in the first device region 3100 and into the gate dielectric layer 222 in the gate trench in the third device region 3300. Because the gate trench in the fourth device region 3400 is free of any dipole layer, the second anneal process 700 at block 522 does not result in any dipole layer material diffusing into the gate dielectric layer 222 in the fourth device region 3400. In some implementations, the second anneal process 700 may last between about 5 seconds and about 20 seconds.

Figure 27:
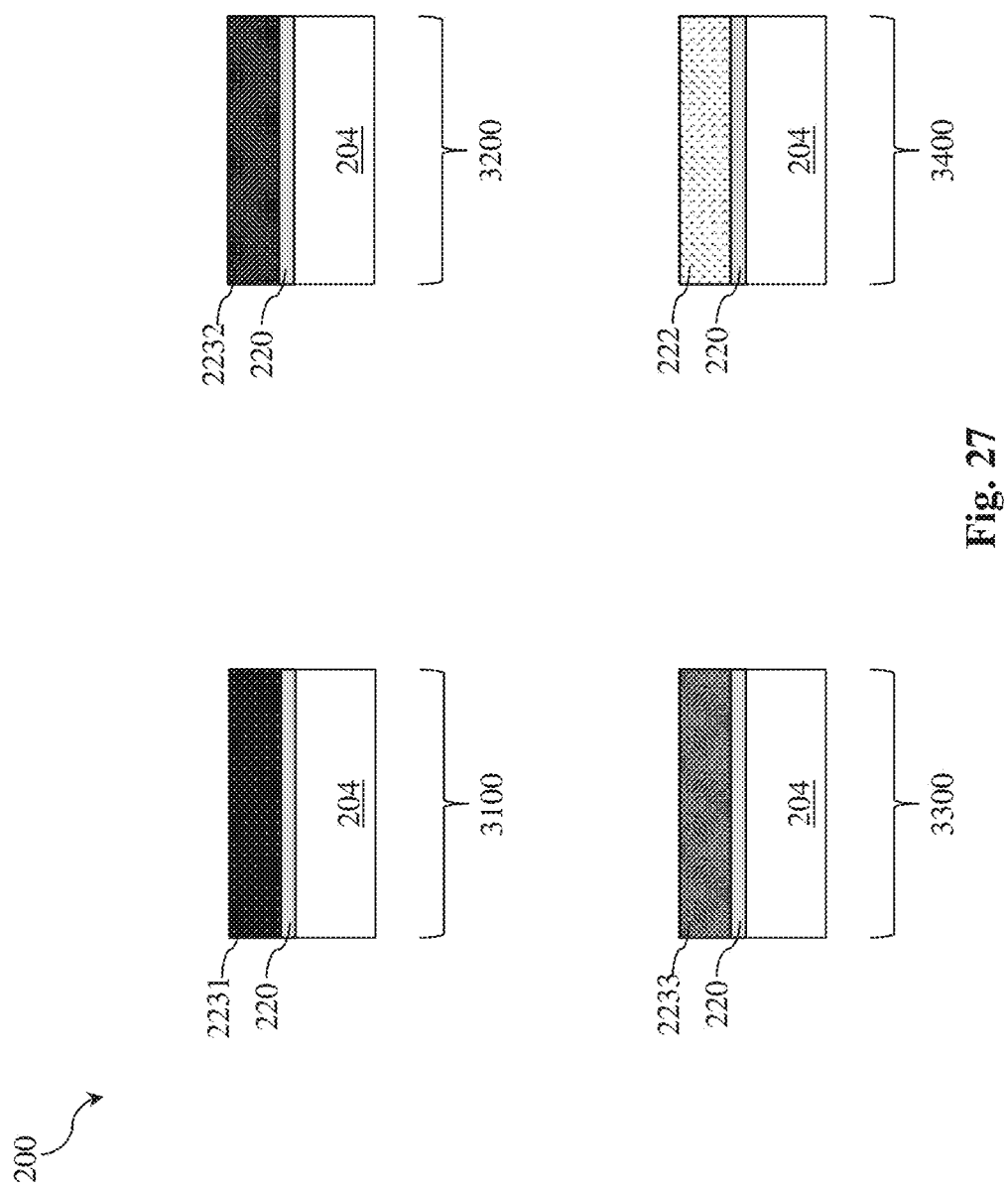

Referring to FIGS. 16 and 27, the method 500 include a block 524 where the second dipole layer 240 are removed from the workpiece 200. The operations at block 524 may be performed using a dry etch process, a wet etch process, or a suitable etch process. After the element in the second dipole layer 240 is thermally driven into the second gate dielectric layer 2232 in the first device region 3100 and gate dielectric layer 222 in the third device region 3300. At block 524, the second dipole layer 240 is removed from the gate trenches in the first device region 3100 and the third device region 3300. Due to the second anneal process 700 at block 522, a first gate dielectric layer 2231 is formed over the gate trench in the first device region 3100 and a third gate dielectric layer 2233 is formed over the gate trench in the third device region 3300. To summarize, the first gate dielectric layer 2231 in the first device region 3100 is formed as a result of the first dipole layer 224 driven in by the first anneal process 600 and the second dipole layer 240 driven in by the second anneal process 700; the second gate dielectric layer 2232 in the second device region 3200 is formed as a result of the first dipole layer 224 driven in by the first anneal process 600; the third gate dielectric layer 2233 in the third device region 3300 is formed as a result of the second dipole layer 240 driven in by the second anneal process 700, and the gate dielectric layer 222 in the fourth device region 3400 is free of diffusion elements from any dipole layer.

It has also been observed that a thicker dipole layer and increased anneal processes contribute to a greater doping concentration of the dipole layer material in the gate dielectric layer 222. For example, when the gate dielectric layer 222 is formed of hafnium oxide and the first dipole layer 224/second dipole layer 240 is formed of lanthanum oxide, operations at block 526 may result in a first lanthanum concentration in the first gate dielectric layer 2231 in the first device region 3100, a second lanthanum concentration in the second gate dielectric layer 2232 in the second device region 3200, a third lanthanum concentration in the third device region 3300, and a fourth lanthanum concentration in the fourth device region 3400. The first lanthanum concentration is greater than the second lanthanum concentration, the second lanthanum concentration is greater than the third lanthanum concentration, and the third lanthanum concentration is greater than the fourth lanthanum concentration. Because the gate trench in the fourth device region 3400 is free of any dipole layer, the fourth lanthanum concentration that is zero. Each of the first, second, third, and fourth lanthanum concentrations may be represented as a ratio of lanthanum concentration (i.e., [lathanum] or [La] from the first dipole layer 224/second dipole layer 240) to hafnium (i.e., [Hafnium] or [Hf] in the gate dielectric layer 222). In the example described above, the first lanthanum concentration (i.e., first lanthanum to hafnium ratio) may be about 0.6 ([La]/[Hf]), the second lanthanum concentration (i.e., second lanthanum to hafnium ratio) may be about 0.4 ([La]/[Hf]), and the third lanthanum concentration (i.e., third lanthanum to hafnium ratio) may be about 0.2 ([La]/[Hf]), while the fourth lanthanum concentration (i.e., fourth lanthanum to hafnium ratio) is zero. The foregoing description generally applies to other dipole layer materials, such as yttrium and aluminum, and other gate dielectric material, such as HfSiO, HfSiON, HfTaO, HfTiO, HfZrO, $ZrO_2$, $TiO_2$, $Ta_2O_5$, provided that different dipole layer material may have different diffusivity and different dipole layer may have different solid solubility in different gate dielectric layers.

Referring to FIGS. 16, 28A and 28B, the method 500 includes a block 526 where further processes are performed to form a first transistor 810 in the first device region 3100, a second transistor 820 in the second device region 3200, a third transistor 830 in the third device region 3300, and a fourth transistor 840 in the fourth device region 3400. As shown in FIGS. 28A and 28B, the first transistor 810 includes the first gate dielectric layer 2231, the second transistor 820 includes the second gate dielectric layer 2232, the third transistor 830 includes the third gate dielectric layer 2233, and the fourth transistor 840 includes the gate dielectric layer 222. Each of the first transistor 810, the second transistor 820, the third transistor 830, and the fourth transistor 840 includes a functional metal gate stack 236 in addition to the interfacial layer 220 and the first gate dielectric layer 2231/second gate dielectric layer 2232/third gate dielectric layer 2233/gate dielectric layer 222. Because the first gate dielectric layer 2231 in the first transistor 810, the second gate dielectric layer 2232 in the second transistor 820, the third gate dielectric layer 2233 in the third transistor 830, and the gate dielectric layer 222 in the fourth transistor 840 are different only in composition but not in dimensions, the functional metal gate stack 236 is structurally and dimensionally uniform across the different device regions 3100, 3200, 3300, and 3400.

The functional metal gate stack 236 may include one or more work function layer and a metal fill layer. N-type devices and p-type devices may have different work functional layers. In some implementations, while n-type device regions and p-type device regions may share certain common work function layers, n-type device regions may include one or more work function layers that are not present in the p-type device regions. Similarly, in alternative implementations, p-type device regions may include one or more work function layers that are not present in the n-type device regions. P-type work function layer includes any suitable p-type work function material, such as TiN, TaN, TaSN, Ru, Mo, Al, WN, WCN $ZrSi_2$, $MoSi_2$, $TaSi_2$, $NiSi_2$, other p-type work function material, or combinations thereof. N-type work function layer includes any suitable n-type work function material, such as Ti, Al, Ag, Mn, Zr, TiAl, TiAlC, TiAlSiC, TaC, TaCN, TaSiN, TaAl, TaAlC, TaSiAlC, TiAlN, other n-type work function material, or combinations thereof. It is noted that p-type work function layers are not limited to use in p-type device regions and n-type work function layers are not limited to use in n-type device regions. P-type work function layers and n-type work function layers may be applied in n-type device regions and p-type device regions to achieve desired threshold voltage. The metal fill layer may be deposited on n-type work function layer(s) and p-type work function layer(s), such that metal fill layer fills any remaining portion of gate trenches in different device regions. The metal fill layer may include a suitable conductive material, such as aluminum (Al), tungsten (W), ruthenium (Ru), and/or copper (Cu). The metal fill layer may additionally or collectively include other metals, metal nitrides, other suitable materials, or combinations thereof.

The first transistor 810 in the first device region 3100, the second transistor 820 in the second device region 3200, the third transistor 830 in the third device region 3300, and the fourth transistor 840 in the fourth device region 3400 have different threshold voltages due to different interface dipoles as a result of use of the first gate dielectric layer 2231, the second gate dielectric layer 2232, the third gate dielectric layer 2233, and the gate dielectric layer 222. Different metal oxides have different areal density of oxygen atoms. For example, areal densities of oxygen atoms in lanthanum oxide and yttrium oxide are greater than that of silicon oxide while areal densities of oxygen atoms in aluminum oxide and hafnium oxide are greater than that of the silicon oxide. Out of these metal oxides, aluminum oxide has the highest areal density of oxygen atoms. In embodiments where the gate dielectric layer 222 consists essentially of hafnium oxide and the interfacial layer 220 consists essentially of silicon oxide, an interface dipole toward the gate dielectric layer 222 may be formed. When lanthanum or yttrium (having lower areal densities of oxygen atoms than silicon oxide) in the first dipole layer 224 and the second dipole layer 240 is allowed to diffuse into the gate dielectric layer 222, the interface dipole toward the gate dielectric layer may be reduced or reversed. When aluminum (having higher areal densities of oxygen atoms than silicon oxide) in the first dipole layer 224 and the second dipole layer 240 is allowed to diffuse into the gate dielectric layer 222, the interface dipole toward the gate dielectric layer may be increased.

In one embodiment where the first gate dielectric layer 2231 has the first lanthanum concentration (i.e., first lanthanum to hafnium ratio) at about 0.6 ([La]/[Hf]), the second gate dielectric layer 2232 has the second lanthanum concentration (i.e., second lanthanum to hafnium ratio) at about 0.4 ([La]/[Hf]), the third gate dielectric layer 2233 has the third lanthanum concentration (i.e., third lanthanum to hafnium ratio) at about 0.2 ([La]/[Hf]), and the gate dielectric layer 222 has the zero fourth lanthanum concentration (i.e., fourth lanthanum to hafnium ratio) at about 0 ([La]/[Hf]), the first transistor 810 has a first threshold voltage (Vt1), the second transistor 820 has a second threshold voltage (Vt2), the third transistor 830 has a third threshold voltage (Vt3), and the fourth transistor 840 has a fourth threshold voltage (Vt4). When the first transistor 810, the second transistor 820, the third transistor 830, and the fourth transistor 840 are n-type transistors, Vt1 may be lower than Vt4 by about 250 mV, Vt2 may be lower than Vt4 by about 150 mV, and Vt3 may be lower than Vt4 by about 50 mV. When the first transistor 810, the second transistor 820, the third transistor 830, and the fourth transistor 840 are p-type transistors, Vt1 may be greater than Vt4 by about 250 mV, Vt1 may be greater than Vt3 by about 150 mV, and Vt1 may be greater than Vt2 by about 50 mV.

The first transistor 810, the second transistor 820, the third transistor 830, and the fourth transistor 840 may be implemented in in a static random access memory (SRAM) cell to improve its signal-to-noise margin (SNM) and write margin (WM). For example, the first transistor 810, the second transistor 820, the third transistor 830, and the fourth transistor 840 may be implemented in the 8T SRAM cell 900 shown in FIGS. 29 and 30 or the 10T SRAM cell 1000 shown in FIGS. 31 and 32.

In some embodiments, the first transistor 810, the second transistor 820, the third transistor 830, and the fourth transistor 840 may be implemented in the 8T SRAM cell 900 shown in FIGS. 29 and 30. In one example, the first transistor 810, with the first threshold voltage Vt1, may be implemented as the first pass-gate transistor (PG1) 902 and the second pass-gate transistor (PG2) 904; the second transistor 820, with the second threshold voltage Vt2, may be implemented as the first pull-down transistor (PD1) 910 and the second pull-down transistor (PD2) 912; the third transistor 830, with the third threshold voltage Vt3, may be implemented as the read pass-gate transistor (RPG) 916; and the fourth transistor 840, with the fourth threshold voltage Vt4, may be implemented as the read pull-down transistor (RPD) 914. In this example, because the third transistor 830 and the fourth transistor 840 have lower threshold voltages than the first transistor 810 and the second transistor 820, the read port 918 may have faster read speed. Additionally, because transistors with greater threshold voltages have smaller leakage currents (i.e., drive currents), the leakage currents through the first pass-gate transistor (PG1) 902 and the second pass-gate transistor (PG2) 904 are smaller than those through the first pull-down transistor (PD1) 910 and the second pull-down transistor (PD2) 912. This arrangement may allow the 8T SRAM cell 900 to have an increased beta ($\beta$) ratio, which translates into increased read stability.

In these embodiments, as the first gate structure 903-1 is shared among the first pull-down transistor (PD1) 910, the second pass-gate transistor (PG2) 904, and the read pass-gate transistor (RPG) 916, the first gate structure 903-1 is shared among one first transistor 810 (implemented as PG2), one second transistor 820 (implemented as PD1), and one third transistor 830 (implemented as RPG). Similarly, as the second gate structure 903-2 is shared among the first pass-gate transistor (PG1) 902, the second pull-down transistor (PD2) 912, and the read pull-down transistor (RPD) 914, the second gate structure 903-2 is shared among one first transistor 810 (implemented as PG1), one second transistor 820 (implemented as PD2) and one fourth transistor 840 (implemented as RPD). As described above, a gate structure is referred to as being shared by or multiple transistors as its functional metal gate stack extend over these transistors. Reference is made to FIGS. 28A and 28B. While the first transistor 810, the second transistor 820, the third transistor 830, and the fourth transistor 840 have different gate dielectric layers, they may have a common functional metal gate stack 236. The common functional metal gate stack 236 allows transistors of the present disclosure to be shared among more than one transistor.

In some other embodiments, the first transistor 810, the second transistor 820, the third transistor 830, and the fourth transistor 840 may be implemented in the 10T SRAM cell 1000 shown in FIGS. 31 and 32. In one example, the first transistor 810, with the first threshold voltage Vt1, may be implemented as the first pass-gate transistor (PG1) 1002 and the second pass-gate transistor (PG2) 1004; the second transistor 820, with the second threshold voltage Vt2, may be implemented as the first pull-down transistor (PD1) 1010 and the second pull-down transistor (PD2) 1012; the third transistor 830, with the third threshold voltage Vt3, may be implemented as the first read pass-gate transistor (RPG1) 1020 and the second read pass-gate transistor (RPG2) 1024; and the fourth transistor 840, with the fourth threshold voltage Vt4, may be implemented as the first read pull-down transistor (RPD1) 1018 and the second read pull-down transistor (RPD2) 1022. In this example, because the third transistor 830 and the fourth transistor 840 have lower threshold voltages than the first transistor 810 and the second transistor 820, the first read port 1014 and the second read port 1016 may have faster read speeds. Additionally, because transistors with greater threshold voltages have smaller leakage currents (i.e., drive currents), the leakage currents through the first pass-gate transistor (PG1) 1002 and the second pass-gate transistor (PG2) 1004 are smaller than those through the first pull-down transistor (PD1) 1010 and the second pull-down transistor (PD2) 1012. This arrangement may allow the 10T SRAM cell 1000 to have an increased beta ($\beta$) ratio, which translates into increased read stability.

In these other embodiments, as the first gate structure 1003-1 is shared among first read pull-down transistor (RPD1) 1018, the first pull-down transistor (PD1) 1010, the second pass-gate transistor (PG2) 1004, and the second read pass-gate transistor (RPG2) 1024, the first gate structure 1003-1 is shared among one first transistor 810 (implemented as PG2), one second transistor 820 (implemented as PD1), one third transistor 830 (implemented as RPG2), and one fourth transistor 840 (implemented as RPD1). Similarly, as the second gate structure 1003-2 is shared among first read pass-gate transistor (RPG1) 1020, the first pass-gate transistor (PG1) 1002, the second pull-down transistor (PD2) 1012, and the second read pull-down transistor (RPD2) 1022, the second gate structure 1003-2 is shared among one first transistor 810 (implemented as PG1), one second transistor 820 (implemented as PD2), one third transistor 830 (implemented as RPG1), and one fourth transistor 840 (implemented as RPD2). As described above, a gate structure is referred to as being shared by or multiple transistors as its functional metal gate stack extend over these transistors. Reference is made to FIGS. 28A and 28B. While the first transistor 810, the second transistor 820, the third transistor 830, and the fourth transistor 840 have different gate dielectric layers, they may have a common functional metal gate stack 236. The common functional metal gate stack 236 allows transistors of the present disclosure to be shared among more than one transistor.

Figure 17:
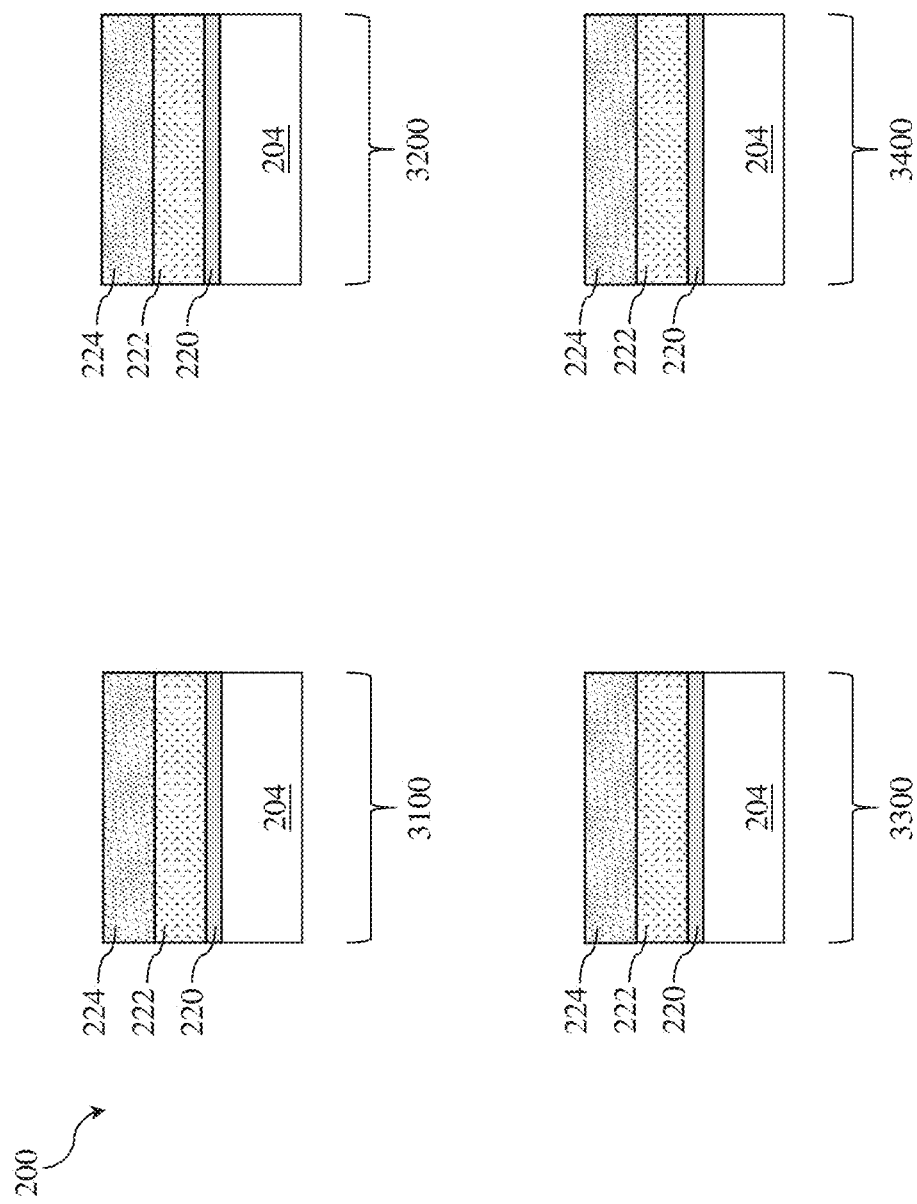
FIGS. 17-27, 28A, and 28B are fragmentary cross-sectional views of a workpiece during various operations of the method of FIG. 16, according to aspects of the present disclosure.

Throughout the present disclosure, similar reference numerals may be used for similar features with similar compositions, provided that multiple device regions and features thereon may be renumbered for different embodiments. For example, the three device regions in FIG. 6 are the first device region 1100, the second device region 1200, and the third device region 1300 while the fourth device regions in FIG. 17 are the first device region 3100, the second device region 3200, the third device region 3300, and the fourth device region 3400. The same numbering convention applies to the gate dielectric layers (e.g., 222, 2221, 2222 in FIGS. 15 and 222, 2231, 2232, and 2233 in FIGS. 28A and 28B), transistors (e.g., 410, 420, and 430 in FIGS. 15 and 810, 820, 830, and 840 in FIGS. 28A and 28B). In addition, while the first dipole layer 224 may be similar with respect to both methods 100 and 500, the second dipole layer 230 in method 100 and the second dipole layer 240 in method 500 may not be similar. For that reason, they are referred to by different reference numerals. Furthermore, the interfacial layer 220, the gate dielectric layer 222 (or the first, second, or third gate dielectric layer, as the case may be in different embodiments), and the functional metal gate stack 236 may be referred to as a metal gate structure or a functional metal gate structure in some instances.

Methods according to the present disclosure provide a mechanism to provide for transistors with different threshold voltages without impacting the process window for gate structure formation. Instead of introducing an additional dipole layer that is going to stay in the gate trench, one or more dipole layers are selectively deposited on a gate dielectric layer and serve as vehicles of diffusion dopants to dope the gate dielectric layer. Depending on the thickness of the dipole layer, the anneal process duration, and the material of the dipole layer, the gate dielectric layer being doped may have different interface dipoles at its interface with the interfacial layer. After the doping process, the use of dipole layer(s) is removed from the gate trench. That is, methods of the present disclosure preserve the up-sides of having different threshold voltages using a dipole layer without the associated down-sides. The present disclosure provides embodiments to implement three levels of threshold voltages in a semiconductor device having three device regions and embodiments to implement four levels of threshold voltages in a semiconductor device having four device regions. Transistors having different levels of threshold voltages of the present disclosure may be applied in SRAM cells, such as 8T SRAM cells or 10T SRAM cells, to improve their performance. After reviewing the present disclosure, a person of ordinary skill in the art will appreciate that more threshold voltages in more device regions are possible.

The present disclosure provides embodiments of semiconductor devices and methods of forming the same. In one embodiment, the present disclosure provides a semiconductor device that includes a first transistor, a second transistor and a third transistor. The first transistor includes a first active region, a first gate dielectric layer over the first active region and including a first concentration of a dipole layer material, and a first gate structure disposed over the first gate dielectric layer. The second transistor includes a second active region, a second gate dielectric layer over the second active region and including a second concentration of the dipole layer material, and a second gate structure disposed over the second gate dielectric layer. The third transistor includes a third active region, a third gate dielectric layer over the third active region including a third concentration of the dipole layer material, and a third gate structure disposed over the third gate dielectric layer. The dipole layer material includes lanthanum oxide, aluminum oxide, or yttrium oxide. The first concentration is greater than the second concentration and the second concentration is greater than the third concentration.

In some implementations, the first gate structure, the second gate structure and the third gate structure are substantially identical to one another. In some instances, the third concentration is zero. In some implementations, the first transistor, the second transistor and the third transistor are n-type transistors. The first transistor includes a first threshold voltage, the second transistor includes a second threshold voltage, and the third transistor includes a third threshold voltage. The first threshold voltage is smaller than the second threshold voltage and the second threshold voltage is smaller than the third threshold voltage. In some implementations, the first transistor, the second transistor and the third transistor are p-type transistors. The first transistor includes a first threshold voltage, the second transistor includes a second threshold voltage, and the third transistor includes a third threshold voltage. The first threshold voltage is greater than the second threshold voltage and the second threshold voltage is greater than the third threshold voltage. In some instances, the first gate dielectric layer, the second gate dielectric layer and the third gate dielectric layer further include hafnium oxide.

In another embodiment, the present disclosure provides a method that includes providing a workpiece including a first device region, a second device region and a third device region, forming a first gate trench in the first device region, a second gate trench in the second device region, and a third gate trench in the third device region, depositing a gate dielectric layer in the first gate trench, the second gate trench, and the third gate trench, depositing a first dipole layer over the gate dielectric layer in the first gate trench, the second gate trench, and the third gate trench, selectively removing the first dipole layer in the second gate trench, depositing a second dipole layer over the first dipole layer in the first gate trench, the gate dielectric layer in the second gate trench, and the first dipole layer in the third gate trench, selectively removing the first dipole layer and the second dipole layer in the third gate trench, and annealing the workpiece.

In some implementations, the method may further include after the annealing of the workpiece, removing the first dipole layer and the second dipole layer from the workpiece. In some instances, the first dipole layer and the second dipole layer include lanthanum oxide, aluminum oxide, or yttrium oxide. In some implementations, the annealing of the workpiece includes a temperature between about 500° C. and about 900° C. In some instances, the annealing of the workpiece includes a duration between about 5 seconds and about 20 seconds. In some implementations, a thickness of the first dipole layer and a thickness of the second dipole layer are between about 1 Å and about 10 Å. In some instances, the selectively removing of the first dipole layer in the second gate trench includes depositing a hard mask layer over the workpiece, depositing a bottom antireflective coating (BARC) layer over the hard mask layer, patterning the BARC layer and the hard mask layer to expose the second gate trench, and removing the first dipole layer in the second gate trench while the first gate trench and the third gate trench are covered by the hard mask layer and the BARC layer. In some instances, the first dipole layer includes a first thickness, the second dipole layer includes a second thickness, and the first thickness is substantially identically to the second thickness.

In yet another embodiment, the present disclosure provides a method that includes providing a workpiece having a first device region, a second device region, a third device region, and a fourth device region, forming a first gate trench in the first device region, a second gate trench in the second device region, a third gate trench in the third device region, a fourth gate trench in the fourth device region, depositing a gate dielectric layer in the first gate trench, the second gate trench, the third gate trench, and the fourth gate trench, depositing a first dipole layer over the gate dielectric layer in the first gate trench, the second gate trench, the third gate trench, and the fourth gate trench, selectively removing the first dipole layer in the third gate trench and the fourth gate trench, performing a first anneal process to the workpiece, removing the first dipole layer in the first gate trench and the second gate trench, after the removing of the first dipole layer, depositing a second dipole layer over the first gate trench, the second gate trench, the third gate trench, and the fourth gate trench, selectively removing the second dipole layer in the second gate trench and the fourth gate trench, performing a second anneal process to the workpiece, and removing the second dipole layer from the workpiece.

In some implementations, the first dipole layer includes a first thickness, the second dipole layer includes a second thickness, and the first thickness is greater than the second thickness. In some instances, the first thickness is between about 5 Å and about 10 Å and the second thickness is between about 1 Å and about 5 Å. In some implementations, the first dipole layer and the second dipole layer include lanthanum oxide, aluminum oxide, or yttrium oxide. In some instances, the first anneal process and the second anneal process includes a temperature between about 500° C. and about 900° C. In some instances, the first anneal process and the second anneal process includes a duration between about 5 seconds and about 20 seconds.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
   a first transistor comprising:
      a first active region,
      a first gate dielectric layer over the first active region, the first gate dielectric layer comprising a first concentration of a dipole layer material, and
      a first gate structure disposed over the first gate dielectric layer;
   a second transistor comprising:
      a second active region,
      a second gate dielectric layer over the second active region, the second gate dielectric layer comprising a second concentration of the dipole layer material, and
      a second gate structure disposed over the second gate dielectric layer; and
   a third transistor comprising:
      a third active region,
      a third gate dielectric layer over the third active region, the third gate dielectric layer comprising a third concentration of the dipole layer material, and
      a third gate structure disposed over the third gate dielectric layer,
   wherein the dipole layer material comprises lanthanum oxide, aluminum oxide, or yittrium oxide,
   wherein the first concentration is greater than the second concentration and the second concentration is greater than the third concentration,
   wherein the first gate structure, the second gate structure and the third gate structure are substantially identical to one another structurally.

2. The semiconductor device of claim 1, wherein the first gate structure, the second gate structure and the third gate structure are substantially identical to one another in terms of composition.

3. The semiconductor device of claim 1, wherein the third concentration is zero.

4. The semiconductor device of claim 1,
   wherein the first transistor, the second transistor and the third transistor are n-type transistors,
   wherein the first transistor comprises a first threshold voltage, the second transistor comprises a second threshold voltage, and the third transistor comprises a third threshold voltage,
   wherein the first threshold voltage is smaller than the second threshold voltage and the second threshold voltage is smaller than the third threshold voltage.

5. The semiconductor device of claim 1,
   wherein the first transistor, the second transistor and the third transistor are p-type transistors,
   wherein the first transistor comprises a first threshold voltage, the second transistor comprises a second threshold voltage, and the third transistor comprises a third threshold voltage,
   wherein the first threshold voltage is greater than the second threshold voltage and the second threshold voltage is greater than the third threshold voltage.

6. The semiconductor device of claim 1, wherein the first gate dielectric layer, the second gate dielectric layer and the third gate dielectric layer further comprise hafnium oxide.

7. A method, comprising:
   providing a workpiece comprising a first device region, a second device region and a third device region;
   forming a first gate trench in the first device region, a second gate trench in the second device region, and a third gate trench in the third device region;
   depositing a gate dielectric layer in the first gate trench, the second gate trench, and the third gate trench;
   depositing a first dipole layer over the gate dielectric layer in the first gate trench, the second gate trench, and the third gate trench;
   selectively removing the first dipole layer in the second gate trench, wherein the selectively removing comprises:
      depositing a hard mask layer over the workpiece,
      depositing a bottom antireflective coating (BARC) layer over the hard mask layer,
      patterning the BARC layer and the hard mask layer to expose the second gate trench, and
      removing the first dipole layer in the second gate trench while the first gate trench and the third gate trench are covered by the hard mask layer and the BARC layer;
   depositing a second dipole layer over the first dipole layer in the first gate trench, the gate dielectric layer in the second gate trench, and the first dipole layer in the third gate trench;
   selectively removing the first dipole layer and the second dipole layer in the third gate trench; and
   annealing the workpiece.

8. The method of claim 7, further comprising:
   after the annealing of the workpiece, removing the first dipole layer and the second dipole layer from the workpiece.

9. The method of claim 8, furthering comprising:
   after the removing of the first dipole layer and the second dipole layer from the workpiece, forming a common metal gate stack in the first gate trench, the second gate trench, and the third gate trench.

10. The method of claim 7, wherein the first dipole layer and the second dipole layer comprise lanthanum oxide, aluminum oxide, or yittrium oxide.

11. The method of claim 7, wherein the annealing of the workpiece comprises a temperature between about 500° C. and about 900° C.

12. The method of claim 7, wherein the annealing of the workpiece comprises a duration between about 5 seconds and about 20 seconds.

13. The method of claim 7, wherein a thickness of the first dipole layer and a thickness of the second dipole layer are between about 1 Å and about 10 Å.

14. The method of claim 7,
   wherein the first dipole layer comprises a first thickness,
   wherein the second dipole layer comprises a second thickness,
   wherein the first thickness is substantially identically to the second thickness.

15. A method, comprising:
   providing a workpiece comprising a first device region, a second device region, a third device region, and a fourth device region;

forming a first gate trench in the first device region, a second gate trench in the second device region, a third gate trench in the third device region, a fourth gate trench in the fourth device region;

depositing a gate dielectric layer in the first gate trench, the second gate trench, the third gate trench, and the fourth gate trench;

depositing a first dipole layer over the gate dielectric layer in the first gate trench, the second gate trench, the third gate trench, and the fourth gate trench;

selectively removing the first dipole layer in the third gate trench and the fourth gate trench;

performing a first anneal process to the workpiece;

removing the first dipole layer in the first gate trench and the second gate trench;

after the removing of the first dipole layer, depositing a second dipole layer over the first gate trench, the second gate trench, the third gate trench, and the fourth gate trench;

selectively removing the second dipole layer in the second gate trench and the fourth gate trench;

performing a second anneal process to the workpiece;

removing the second dipole layer from the workpiece; and after the removing of the second dipole layer, forming a common metal gate stack in the first gate trench, the second gate trench, the third gate trench, and the fourth gate trench.

16. The method of claim 15,
wherein the first dipole layer comprises a first thickness,
wherein the second dipole layer comprises a second thickness,
wherein the first thickness is greater than the second thickness.

17. The method of claim 16, wherein the first thickness is between about 5 Å and about 10 Å and the second thickness is between about 1 Å and about 5 Å.

18. The method of claim 16, wherein the first dipole layer and the second dipole layer comprise lanthanum oxide, aluminum oxide, or yittrium oxide.

19. The method of claim 16, wherein the first anneal process and the second anneal process comprises a temperature between about 500° C. and about 900° C.

20. The method of claim 16, wherein the first anneal process and the second anneal process comprises a duration between about 5 seconds and about 20 seconds.

* * * * *